(12) United States Patent
Okumura et al.

(10) Patent No.: US 7,862,959 B2
(45) Date of Patent: Jan. 4, 2011

(54) TRANSFER MASK FOR EXPOSURE AND PATTERN EXCHANGING METHOD OF THE SAME

(75) Inventors: Katsuya Okumura, Tokyo-To (JP); Kazuya Nagaseki, Nirasaki (JP); Naoyuki Satoh, Nirasaki (JP)

(73) Assignees: Octec Inc., Tokyo-To (JP); Tokyo Electron Limited, Tokyo-To (JP)

( * ) Notice: Subject to any disclaimer, the term of this patent is extended or adjusted under 35 U.S.C. 154(b) by 1082 days.

(21) Appl. No.: 11/030,963

(22) Filed: Jan. 10, 2005

(65) Prior Publication Data

US 2005/0118516 A1 Jun. 2, 2005

(51) Int. Cl.
*G03F 1/00* (2006.01)
*G03F 7/20* (2006.01)

(52) U.S. Cl. .......................... 430/5; 430/296
(58) Field of Classification Search ............. 430/5, 430/296; 250/492.1, 492.2–492.3, 503.1
See application file for complete search history.

(56) References Cited

U.S. PATENT DOCUMENTS

| | | | |
|---|---|---|---|
| 5,036,209 | A | 7/1991 | Kataoka et al. |
| 5,656,398 | A * | 8/1997 | Miyachi et al. ............ 430/5 |
| 5,972,794 | A * | 10/1999 | Katakura .................. 438/704 |
| 6,171,736 | B1 | 1/2001 | Hirayanagi |
| 6,180,289 | B1 | 1/2001 | Hirayanagi |
| 6,214,498 | B1 | 4/2001 | Choi |
| 6,573,519 | B1 | 6/2003 | Takemoto |
| 2002/0042006 | A1 * | 4/2002 | Kawata ..................... 430/5 |
| 2002/0122993 | A1 * | 9/2002 | Katakura .................. 430/5 |

FOREIGN PATENT DOCUMENTS

| | | |
|---|---|---|
| DE | 100 42 626 A1 | 8/2000 |
| EP | 364 929 | 4/1990 |
| JP | 05-090139 | 4/1993 |

(Continued)

OTHER PUBLICATIONS

Cover page of PCT Publication No. WO 2004/008508 with International Search Report (PCT/ISA/210), issued in connection with PCT/JP2003/008608.

(Continued)

*Primary Examiner*—Mark F Huff
*Assistant Examiner*—Jonathan Jelsma
(74) *Attorney, Agent, or Firm*—Smith, Gambrell & Russell, LLP

(57) ABSTRACT

The present invention is a transfer mask for exposure comprising a mask portion having a plurality of cells, each of which an opening of a predetermined pattern is formed in. When one side of the plurality of cells is exposed to a charged particle beam, each of the plurality of cells is adapted to make the charged particle beam pass through itself to the other side thereof based on the pattern of the opening formed in the cell. Thus, when a substrate to be processed is arranged on the other side of the cell, the pattern of the opening formed in the cell is transferred to the substrate to be processed and hence an exposure pattern is formed on the substrate to be processed. The feature of the present invention is that a part of or all the plurality of cells can be exchanged at the mask portion.

10 Claims, 21 Drawing Sheets

FOREIGN PATENT DOCUMENTS

| | | |
|---|---|---|
| JP | 10-204153 | 4/1998 |
| JP | 11-040486 | 2/1999 |
| JP | 11-054413 | 2/1999 |
| JP | 2000-150344 | 5/2000 |
| JP | 2000-150344 A | 5/2000 |
| JP | 2000150344 | 5/2000 |

OTHER PUBLICATIONS

Notification of Receipt of Record (PCT/IB/301) issued in connection with PCT/JP2003/008608.

Notification Concerning Submission or Transmittal of Priority Document (PCT/IB/304) issued in connection with PCT/JP2003/008608.

Notification of the Recording of a Change (PCT/IB/306) issued in connection with PCT/JP2003/008608.

Notice Informing the Applicant of the Communication of the International Application to the designated Offices (PCT/IB/308) issued in connection with PCT/JP2003/008608.

Information Concerning Elected Offices Noticed of Their Election (PCT/IB/332), issued in connection with PCT/JP2003/008608.

Form PCT/IB/401 (in Japanese) issued in connection with PCT/JP2003/008608.

Form PCT/IB/409 and PCT/IB/416 (in Japanese) issued in connection with PCT/JP2003/008608.

International Preliminary Examination Report (PCT/IPEA/409) (translated) issued for PCT/JP2003/008608.

Notification of Transmittal of Translation of the International Preliminary Examination Report (PCT/IB/338) issued for PCT/JP2003/008608.

European Office Action issued Feb. 25, 2008.

* cited by examiner

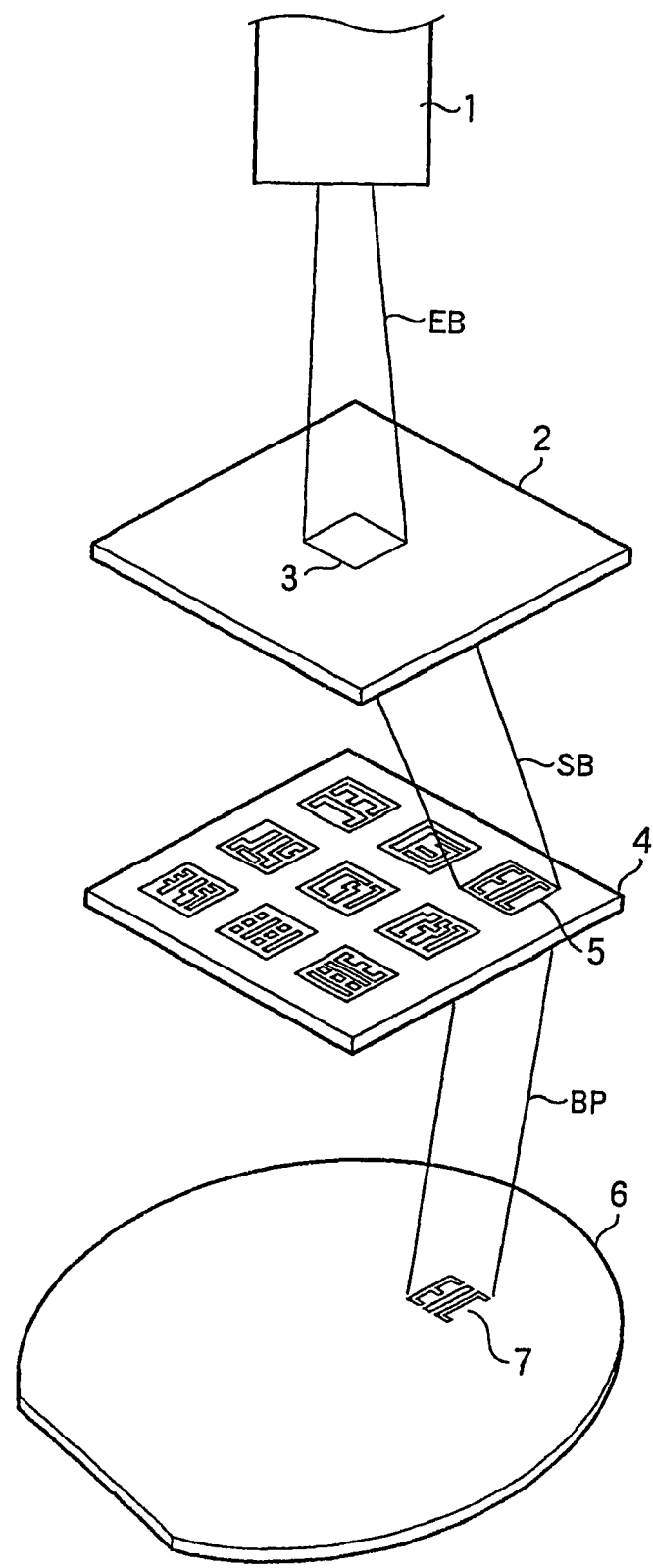
F I G. 1

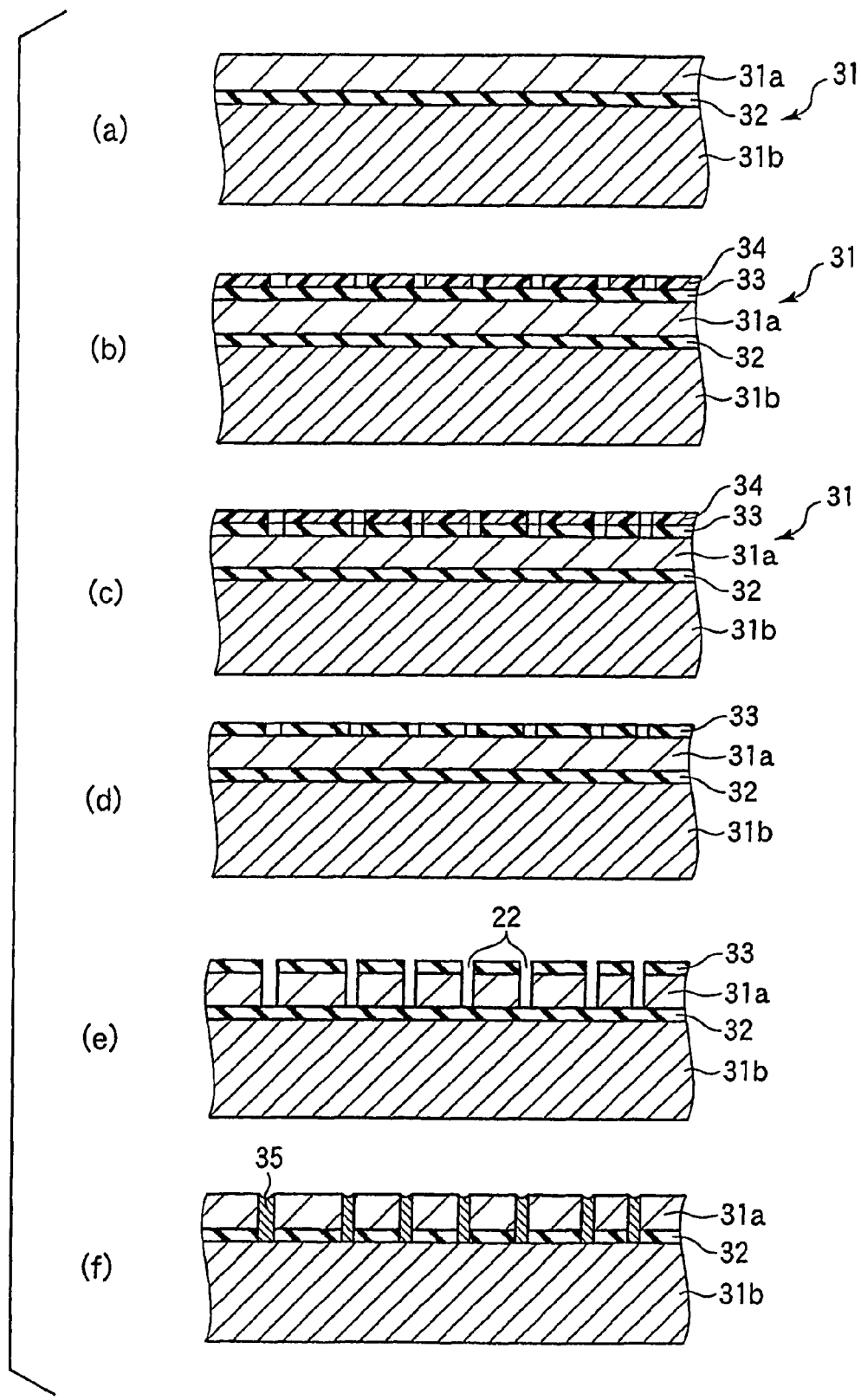
F I G. 5

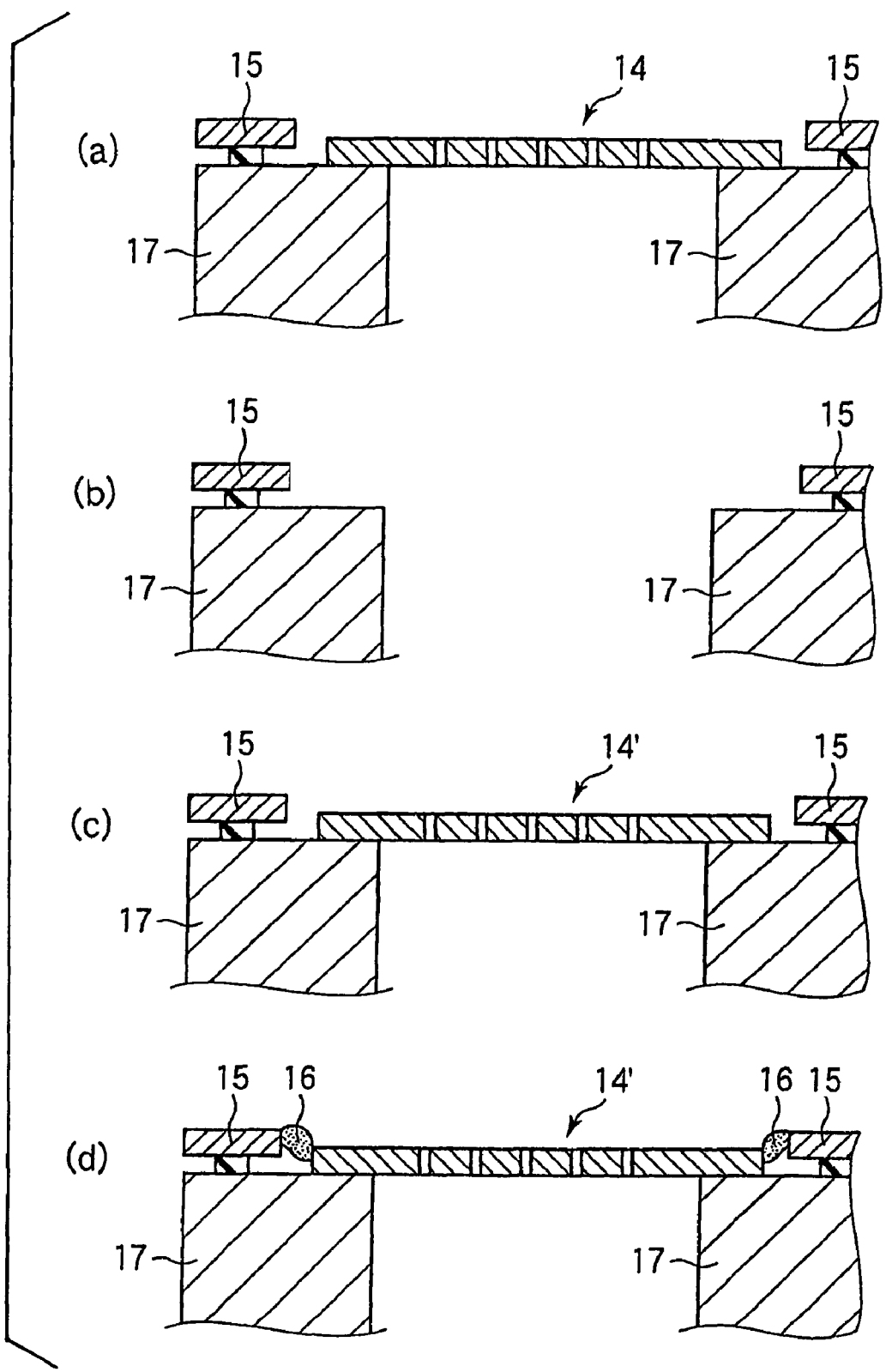
F I G. 7

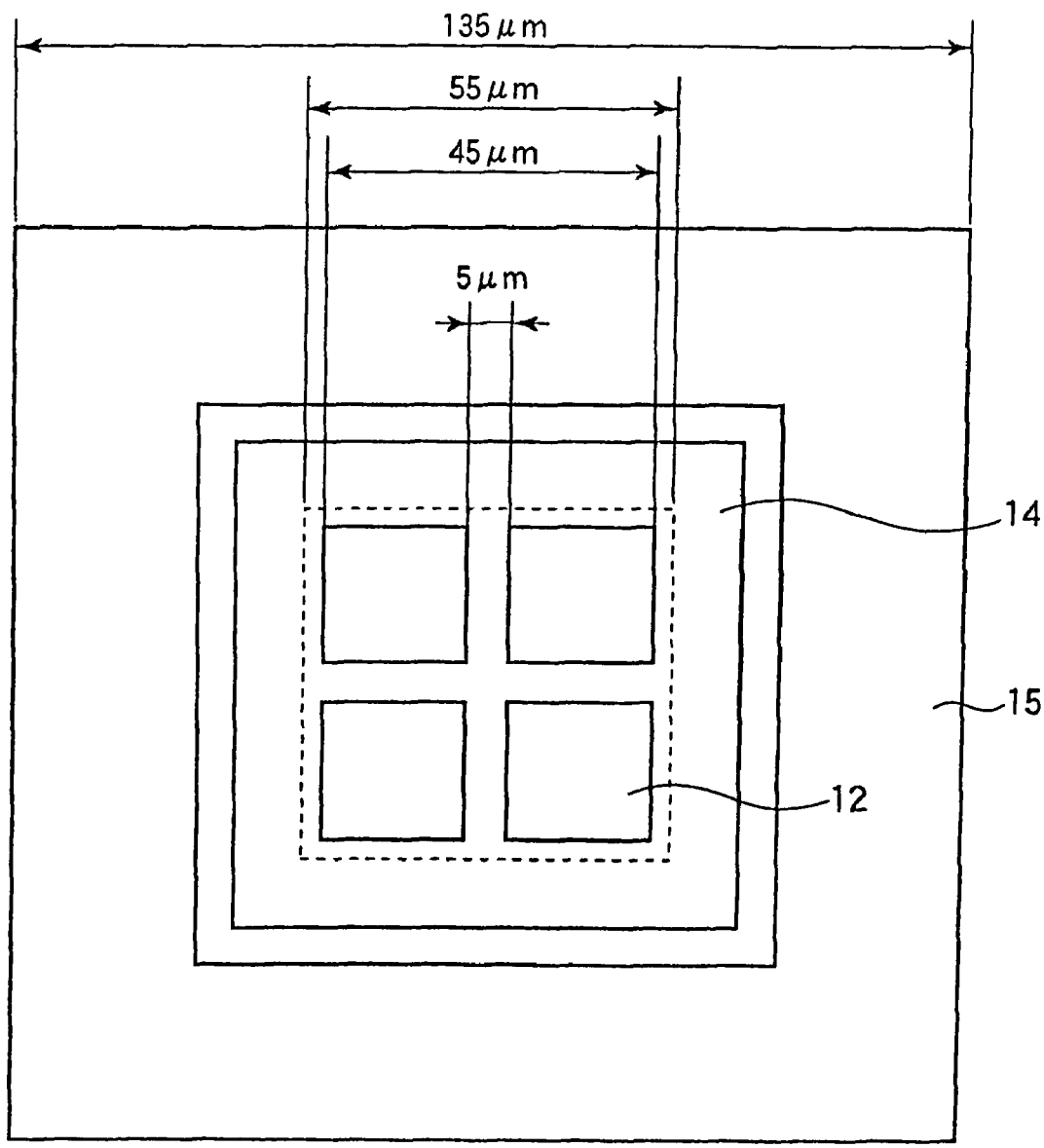
F I G. 12

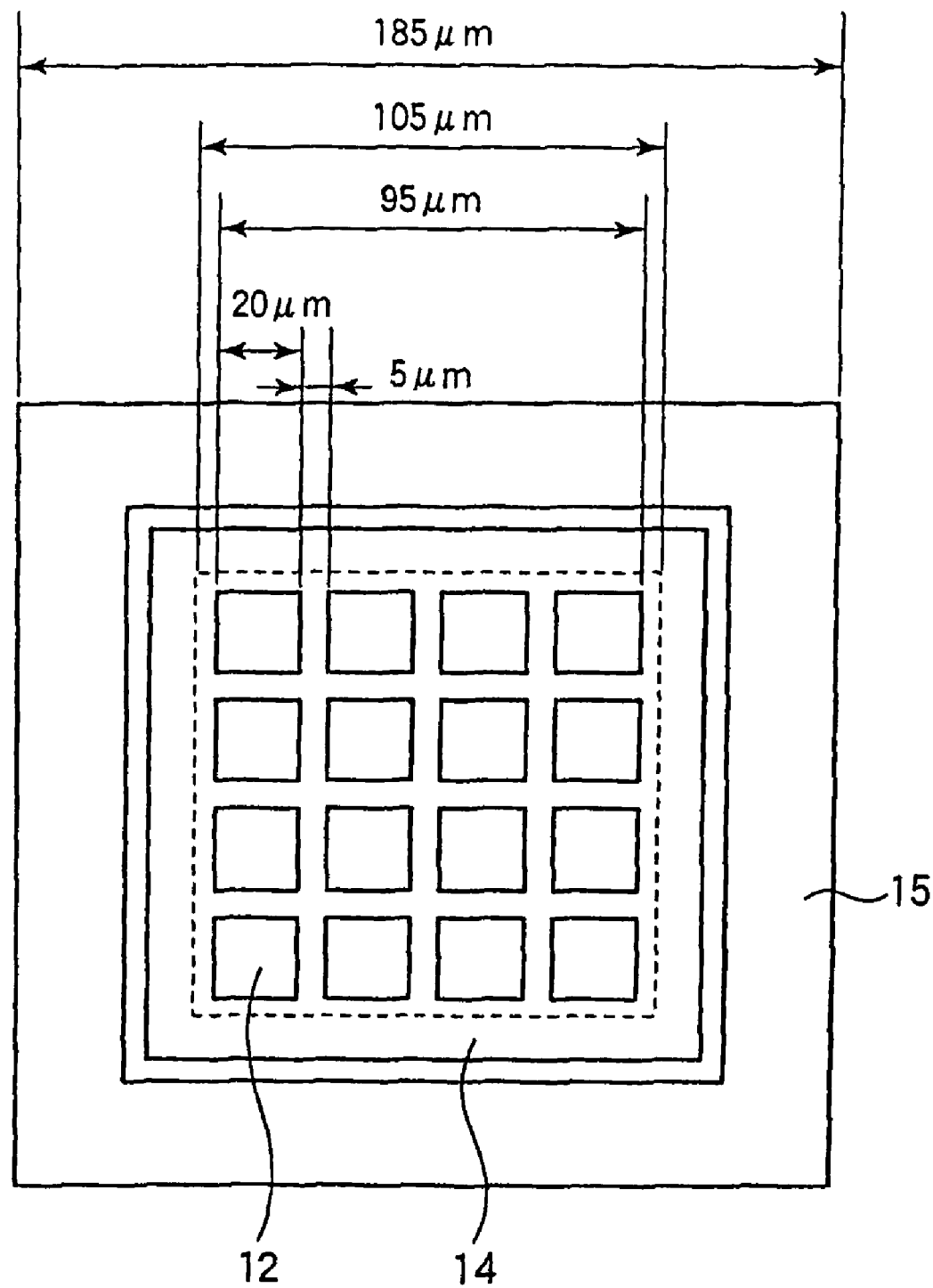
F I G. 14

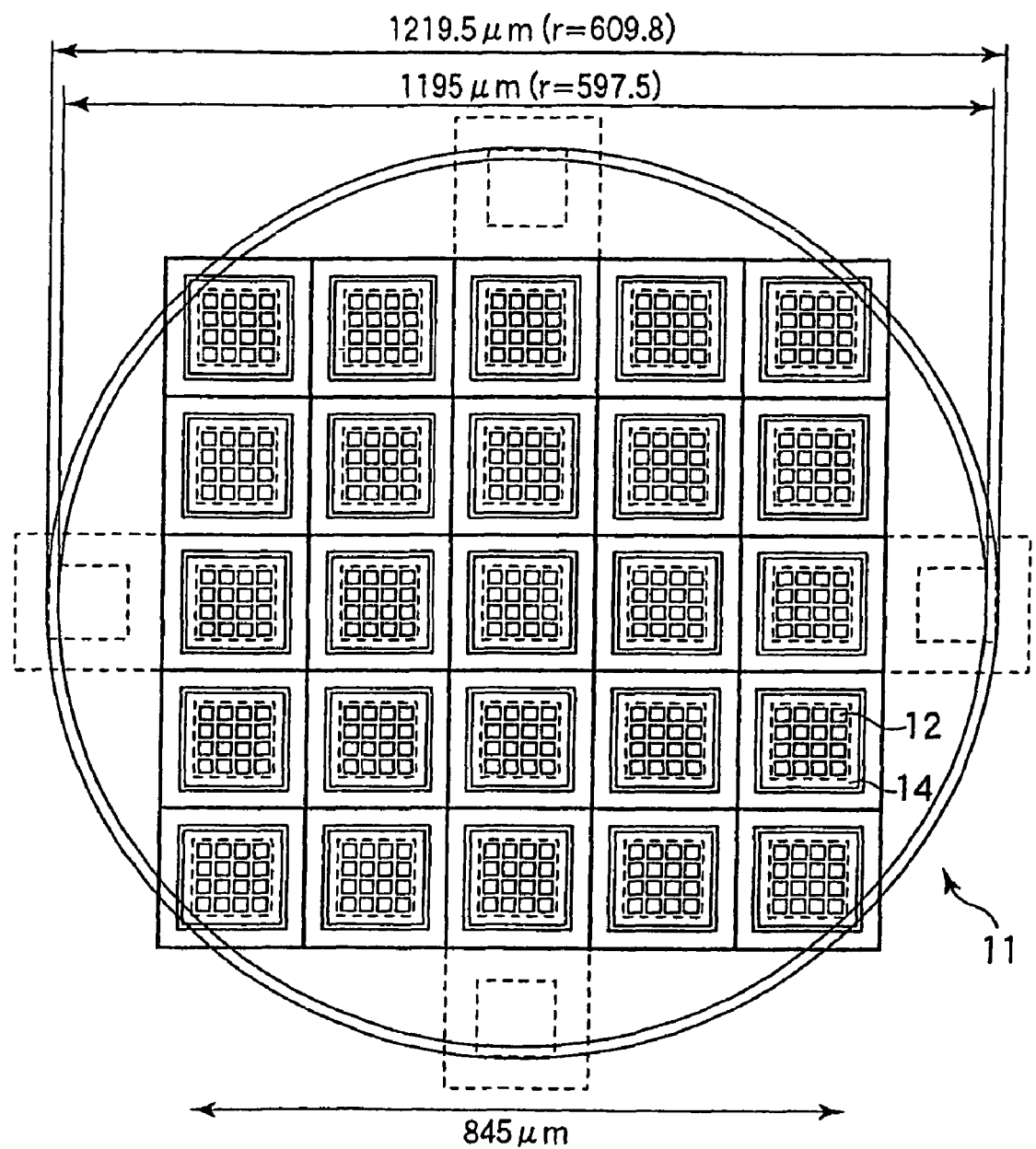
F I G. 15

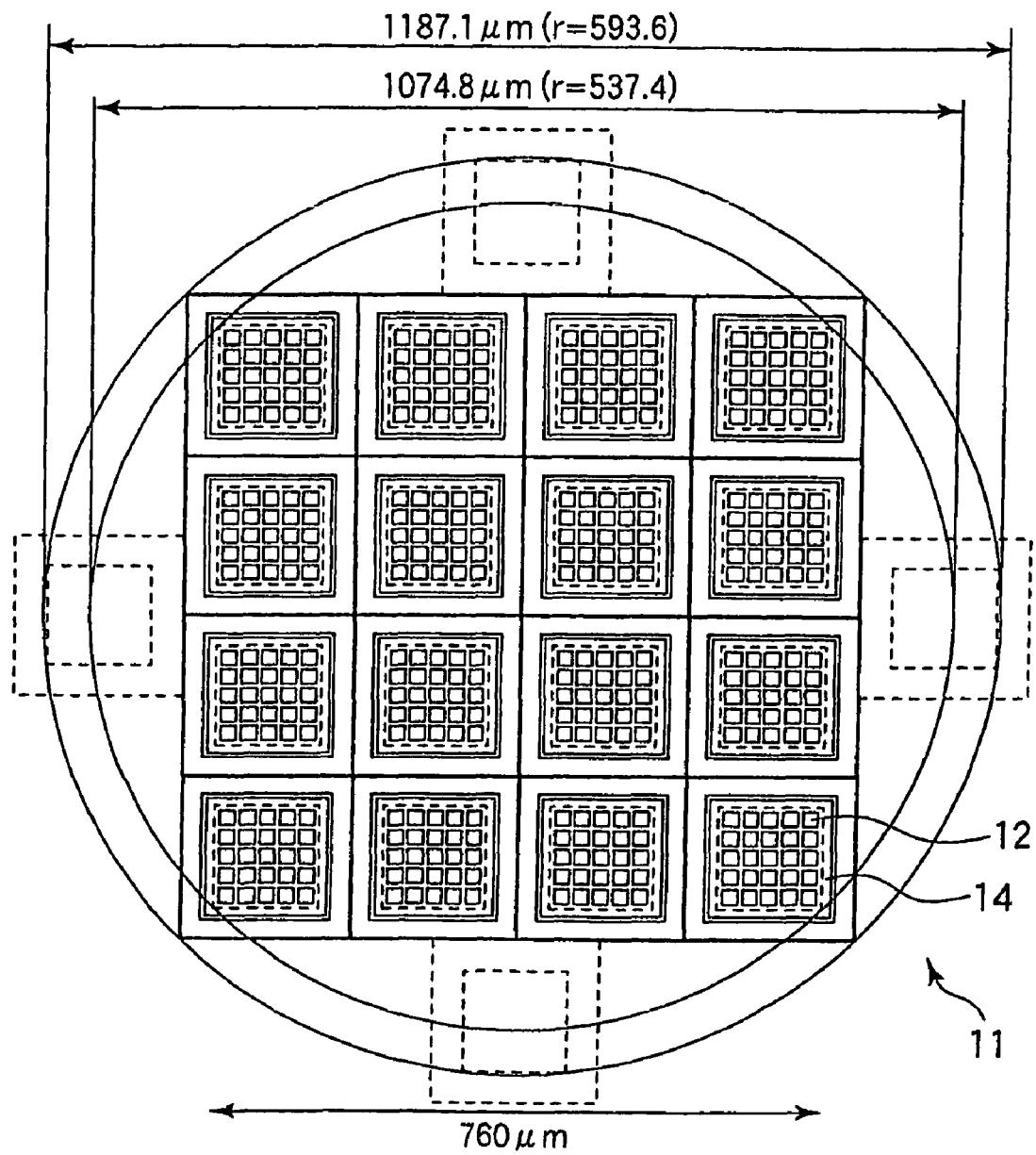
F I G. 17

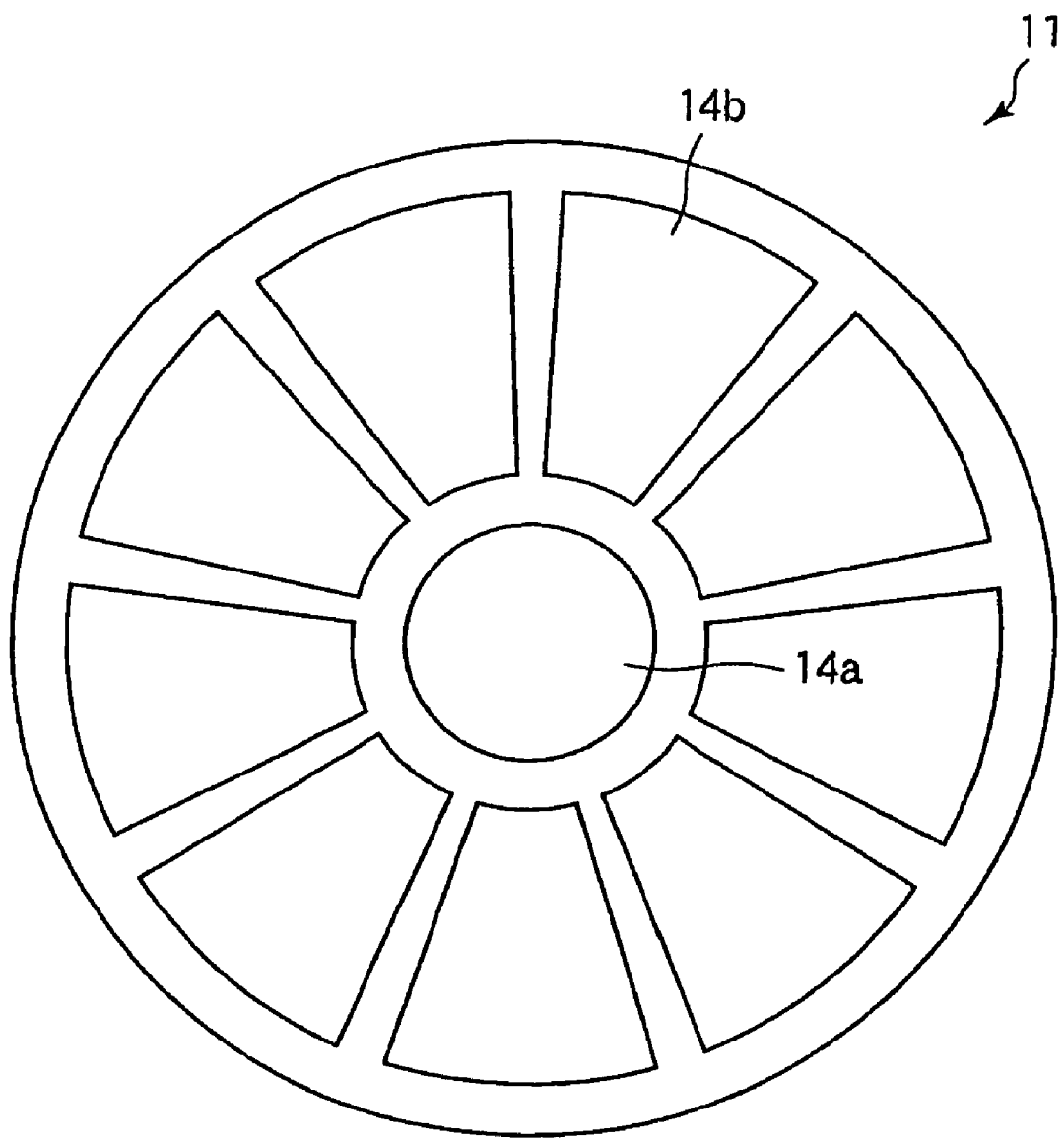
F I G. 21

TRANSFER MASK FOR EXPOSURE AND PATTERN EXCHANGING METHOD OF THE SAME

TECHNICAL FIELD

The present invention relates to a transfer mask for exposure, which is used in an exposure process by means of a charged particle beam such as an electron beam, and to a pattern exchanging method of the transfer mask for exposure.

BACKGROUND ART

In manufacturing semiconductor devices, lithography technique is used for a pattern formation. Conventionally, reduction projecting lithography technique wherein a mask is used is mainly used as the lithography technique. The reduction projecting lithography technique can achieve high throughput. However, the reduction projecting lithography technique needs an expensive mask set, which may be several decade million yen to one hundred million yen. In the present semiconductor industry, general LSI has been changed to system LSI, which is manufactured mainly through small-amount but many-kinds production. Thus, it is difficult to regain the high mask cost. In addition, mask manufacturing time is as long as one month, which is fatal in the system LSI that requires short TAT (turn-around time).

As a new-era lithography technique that solves the above problem, electron-beam direct writing technique has been paid attention to. According to the electron-beam direct writing technique, it is unnecessary to use an expensive mask, differently from the conventional reduction projecting lithography technique, but it is possible to form a minute pattern of 0.15 µm or smaller. That is, the above problem caused by the mask can be solved. However, the electron-beam direct writing technique has a defect of low throughput.

A character-projection (CP) type of technique has been proposed as a technique of improving the throughput in the electron-beam lithography technique. In that technique, a transfer mask for exposure, which is called a CP aperture mask and has a lot of various-character-patterned cells, is formed, and a semiconductor wafer is exposed to an electron beam selectively through a specific character pattern of the CP aperture mask. Thus, a pattern can be exposed at the one-time exposure step, although the pattern needs a lot of beam shots by the conventional variable shape writing manner or the like. Thus, the writing speed can be remarkably increased. That is, the throughput can be remarkably enhanced.

However, in the character-projection type of technique, various character patterns have to be formed in the CP aperture mask in advance. Thus, if a user wants to change a pattern to another, or if a part of the cells has a defect or the like, the whole CP aperture mask has to be manufactured from the beginning. This is a problem in view of cost and delivery time of the CP aperture mask.

SUMMARY OF THE INVENTION

This invention is developed by focusing the aforementioned problems. The object of the present invention is to provide a transfer mask for exposure and a pattern exchanging method of the transfer mask for exposure, which can cope with a case wherein a user wants to change a pattern or another case wherein a part of cells has a defect, in the character-projection type of technique.

In order to solve the above problems, the present invention is a transfer mask for exposure comprising a mask portion having a plurality of cells, each of which an opening of a predetermined pattern is formed in, wherein when one side of the plurality of cells is exposed to a charged particle beam, each of the plurality of cells is adapted to make the charged particle beam pass through itself to the other side thereof based on the pattern of the opening formed in the cell, so that when a substrate to be processed is arranged on the other side of the cell, the pattern of the opening formed in the cell is transferred to the substrate to be processed and an exposure pattern is formed on the substrate to be processed, and wherein a part of or all the plurality of cells can be exchanged at the mask portion.

According to the above feature, since the part of or all the plurality of cells, each of which an opening of a predetermined pattern is formed in, can be exchanged, if a user wants to change a pattern to another or if a pattern has a defect or the like, a cell including the pattern can be exchanged. Thus, even if a user wants to change-a pattern to another or even if a pattern has a defect or the like, it is unnecessary to manufacture a new transfer mask for exposure from the beginning. Therefore, a problem of cost and delivery time of the new transfer mask for exposure doesn't arise.

Preferably, the mask portion has one or more blocks, each of which contains one or more cells, and the plurality of cells can be exchanged by every block. In the case, the number of cells to be exchanged at a time can be freely set.

In addition, preferably, the blocks are arranged in such a manner that a circle (tangent circle) surrounding all the blocks has a minimum diameter. In the case, deflection of the charged particle beam can be reduced as much as possible.

For example, each of the blocks contains a plurality of rectangular cells that are arranged in a square shape.

Preferably, the mask portion mainly consists of silicon.

In addition, the present invention is a transfer mask for exposure comprising a mask portion having a plurality of cells, each of which an opening of a predetermined pattern is formed in; wherein the mask portion has one or more blocks, each of which contains one or more cells, the mask portion has one or more supporting parts that support the one or more blocks, the mask portion has one or more adhesive members that adhesively connect the one or more blocks and the one or more supporting parts and are capable of being removed at any time, and the one or more blocks can be exchanged to new blocks by removing the corresponding one or more adhesive members.

According to the above feature, since the one or more blocks can be exchanged to new blocks by removing the corresponding one or more adhesive members, if a user wants to change a pattern to another or if a pattern has a defect or the like, a block including the pattern can be exchanged. Thus, even if a user wants to change a pattern to another or even if a pattern has a defect or the like, it is unnecessary to manufacture a new transfer mask for exposure from the beginning. Therefore, a problem of cost and delivery time of the new transfer mask for exposure doesn't arise.

In addition, an operation of exchanging the block can be easily carried out because the block can be removed by only removing the adhesive member.

Preferably, each of the supporting parts contains a stopper part that positions the corresponding block via the adhesive member, and a beam part that supports the stopper part and that protrudes under the corresponding block.

In the case, after a previous block is removed, a new block can be placed on the beam part. In addition, the new block can be positioned by the stopper part, so that the new block can be mounted easily.

Preferably, each of the supporting parts is arranged to surround the corresponding block, and one or more adhesive members are arranged at the whole circumference of the block or at a plurality of positions around the block.

In addition, preferably, the blocks are arranged in such a manner that a circle surrounding all the blocks has a minimum diameter. In the case, deflection of the charged particle beam can be reduced as much as possible.

For example, each of the blocks contains a plurality of rectangular cells that are arranged in a square shape.

Preferably, the blocks and the supporting parts mainly consist of silicon, and the adhesive members consist of a material including carbon.

In addition, the present invention is a pattern exchanging method of a transfer mask for exposure, the transfer mask for exposure including a mask portion having a plurality of cells, each of which an opening of a predetermined pattern is formed in, wherein the mask portion has one or more blocks, each of which contains one or more cells, the mask portion has one or more supporting parts that supports the one or more blocks, the mask portion has one or more adhesive members that adhesively connects the one or more blocks and the one or more supporting parts and are capable of being removed at any time, and each of the supporting parts contains a stopper part that positions the corresponding block via the adhesive member and a beam part that supports the stopper part and that protrudes under the corresponding block; the method comprising: a step of removing an adhesive member that connects a block having a pattern to be exchanged, in order to remove the block; a step of placing a new block on a beam part of a supporting part corresponding to the removed block; and a step of adhesively connecting the stopper part of the supporting part corresponding to the removed block and the new block by means of an adhesive member.

According to the above method, a pattern exchanging operation of a transfer mask for exposure can be carried out practically and easily.

The adhesive member can be removed by an ashing process, for example.

In addition, the present invention is a manufacturing method of a transfer mask for exposure, the transfer mask for exposure including a mask portion having a plurality of cells, each of which an opening of a predetermined pattern is formed in, wherein the mask portion has one or more blocks, each of which contains one or more cells, the mask portion has one or more supporting parts that supports the one or more blocks, the mask portion has one or more adhesive members that adhesively connects the one or more blocks and the one or more supporting parts and are capable of being removed at any time, and each of the supporting parts contains a stopper part that positions the corresponding block via the adhesive member, and a beam part that supports the stopper part and that protrudes under the corresponding block, the method comprising: a step of forming the plurality of cells and the stopper parts by a dry etching process; a step of forming the beam parts by both a machining process and an etching process; and a step of connecting the blocks and the stopper parts by means of the adhesive members.

In addition, the present invention is an exposure system comprising: a charged particle beam gun that irradiates a charged particle beam; a shaping aperture mask in which a rectangular aperture has been formed; and a transfer mask for exposure including a mask portion having a plurality of cells, each of which an opening of a predetermined pattern is formed in; wherein when one side of the plurality of cells is exposed to a charged particle beam irradiated from the charged particle beam gun through the shaping aperture mask, each of the plurality of cells is adapted to make the charged particle beam pass through itself to the other side thereof based on the pattern of the opening formed in the cell, so that when a substrate to be processed is arranged on the other side of the cell, the pattern of the opening formed in the cell is transferred to the substrate to be processed and an exposure pattern is formed on the substrate to be processed, and wherein a part of or all the plurality of cells can be exchanged at the mask portion.

In addition, the present invention is an exposure method using an exposure system, the exposure system including a charged particle beam gun that irradiates a charged particle beam, a shaping aperture mask in which a rectangular aperture has been formed, and a transfer mask for exposure including a mask portion having a plurality of cells, each of which an opening of a predetermined pattern is formed in, wherein when one side of the plurality of cells is exposed to a charged particle beam irradiated from the charged particle beam gun through the shaping aperture mask, each of the plurality of cells is adapted to make the charged particle beam pass through itself to the other side thereof based on the pattern of the opening formed in the cell, so that when a substrate to be processed is arranged on the other side of the cell, the pattern of the opening formed in the cell is transferred to the substrate to be processed and an exposure pattern is formed on the substrate to be processed, and wherein a part of or all the plurality of cells can be exchanged at the mask portion, the method comprising: a step of causing the charged particle beam gun to irradiate the charged particle beam through the shaping aperture mask;, and a step of exposing the one side of the plurality of cells to the charged particle beam that has been passed through the shaping aperture mask and making the charged particle beam pass through the cells to the other side of the cells, in order to transfer the pattern of the opening formed in the cell to the substrate to be processed, to form the exposure pattern on the substrate to be processed.

BRIEF DESCRIPTION OF THE DRAWINGS

FIG. 1 is a schematic view showing a character-projection (CP) type of electron-beam exposure system that uses a transfer mask for exposure according to an embodiment of the present invention;

FIG. 5 is sectional views showing a surface processing step of the CP aperture mask according to the second embodiment of the present invention;

FIG. 7 is sectional views explaining block-exchanging operations of the CP aperture mask according to the second embodiment of the present invention;

FIG. 12 is a plan view showing an example of dimensions of a block and a block fixing part wherein four cells are mounted on the block;

FIG. 14 is a plan view showing an example of dimensions of a block and a block fixing part wherein sixteen cells are mounted on the block;

FIG. 15 is a plan view showing an arrangement of blocks wherein sixteen cells are mounted on each block and wherein a circle surrounding the blocks and the block fixing parts has a minimum diameter;

FIG. 17 is a plan view showing an arrangement of blocks wherein twenty-five cells are mounted on each block and wherein a circle surrounding the blocks and the block fixing parts has a minimum diameter;

FIG. 21 is a plan view showing an example wherein blocks are arranged in a circle shape.

DESCRIPTION OF THE PREFERRED EMBODIMENT

Figure 2:
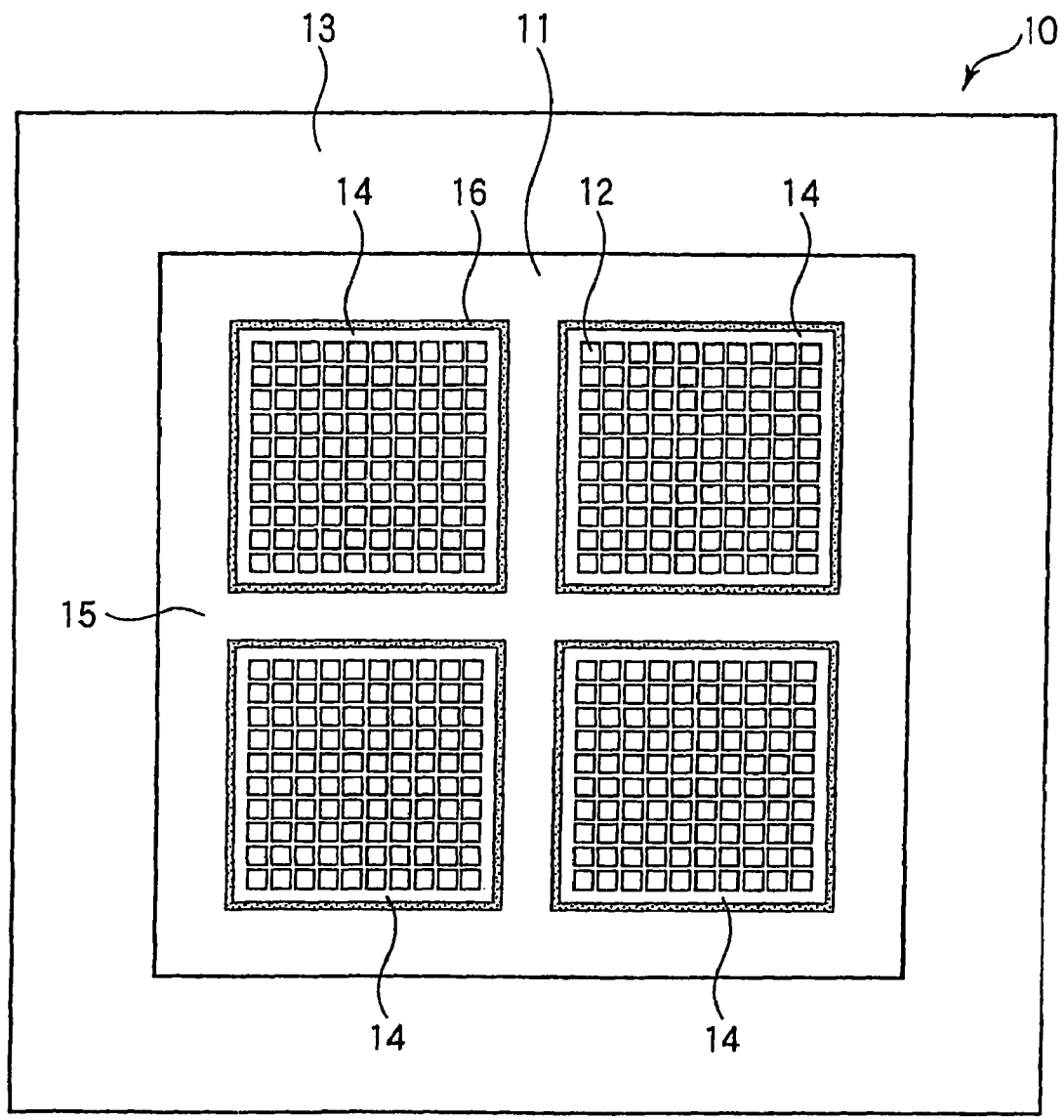
FIG. 2 is a plan view showing a CP aperture mask according to a second embodiment of the present invention.

Hereinafter, embodiments of the present invention are explained with reference to the attached drawings.

FIG. 1 is a schematic view showing a character-projection (CP) type of electron-beam exposure system that uses a transfer mask for exposure according to an embodiment of the present invention.

As shown in FIG. 1, a shaping aperture mask 2 having a rectangular aperture 3 is arranged under an electron beam gun 1 that irradiates an electron beam. A CP aperture mask 4 having many cells 5, each of which a character pattern is formed in, is arranged under the shaping aperture mask 2. The CP aperture mask 4 is a transfer mask for exposure of the present embodiment. The character patterns of the respective cells 5 are widely various. A semiconductor wafer 6 to be exposed in a pattern is arranged on a stage (not shown) under the CP aperture mask 4.

In the CP type of electron-beam exposure system as shown in FIG. 1, the electron beam EB irradiated from the electron beam gun 1 passes through the rectangular aperture 3 of the shaping aperture mask 2 to become a shaping beam SB. The shaping beam SB is selectively irradiated to a predetermined cell 5 of the CP aperture mask 4 having a predetermined character pattern, so that the shaping beam SB passes through the CP aperture mask 4 to become a beam pattern BP. The beam pattern BP is projected at a reduction onto the semiconductor wafer 6 as a pattern 7.

When the above CP type of electron-beam exposure system is used, one character pattern can be exposed at one-time irradiating (exposing) step. Thus, compared with the conventional variable shape writing type that needs a lot of beam shots, writing speed can be remarkably increased.

Figure 3:
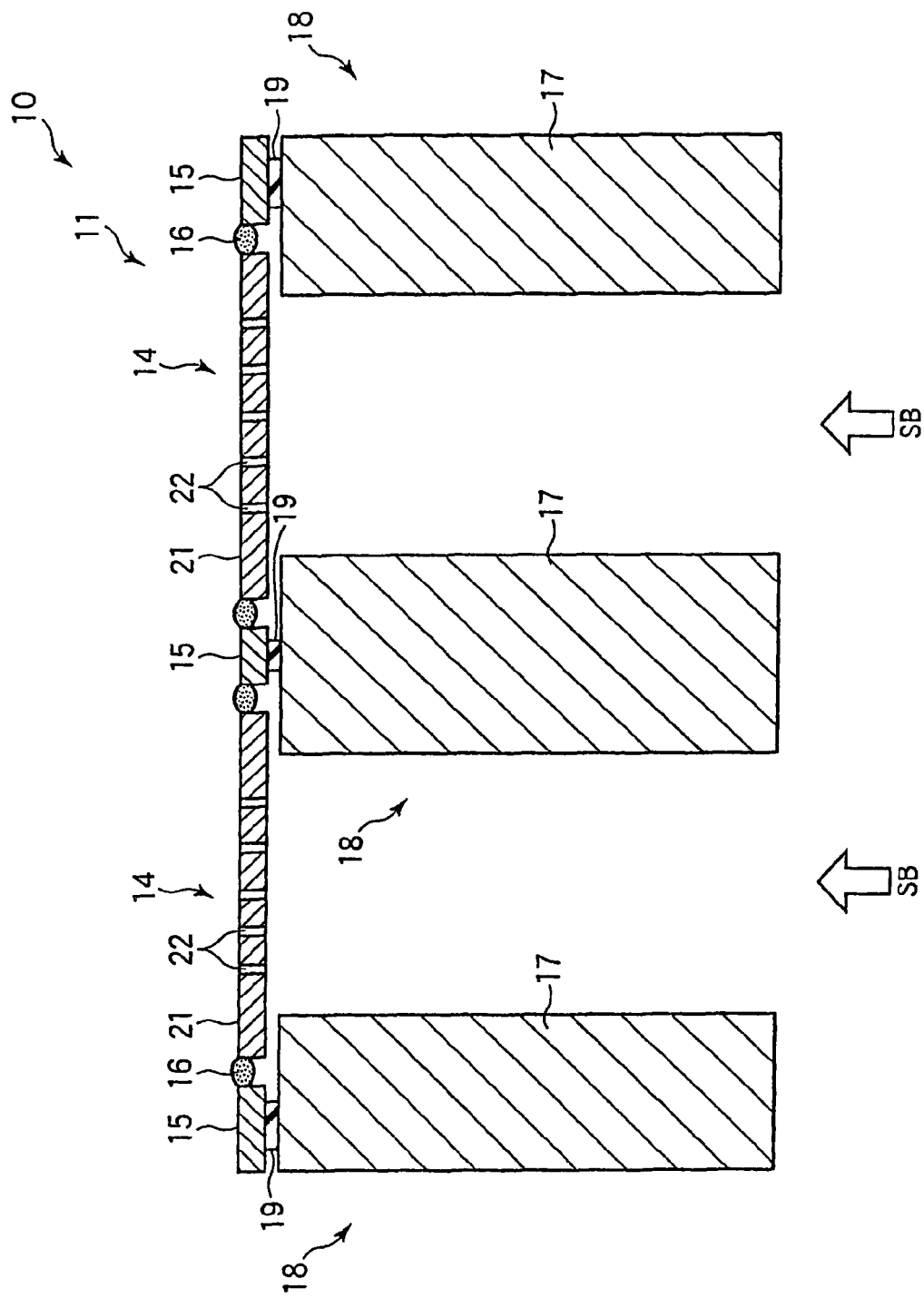
FIG. 3 is a sectional view showing the CP aperture mask according to the second embodiment of the present invention.

Next, a CP aperture mask according to a second embodiment of the present invention, which is applicable to the above CP type of electron-beam exposure system, is explained. FIG. 2 is a plan view showing the CP aperture mask of the second embodiment, and FIG. 3 is a sectional view thereof.

The CP aperture mask 10 of the embodiment has: a mask part 11 in which four hundred cells 12 are formed; and a guide part 13 supporting the mask part 11 and functioning as a guide of a holder. Different character patterns are formed in the respective cells.

Figure 4:
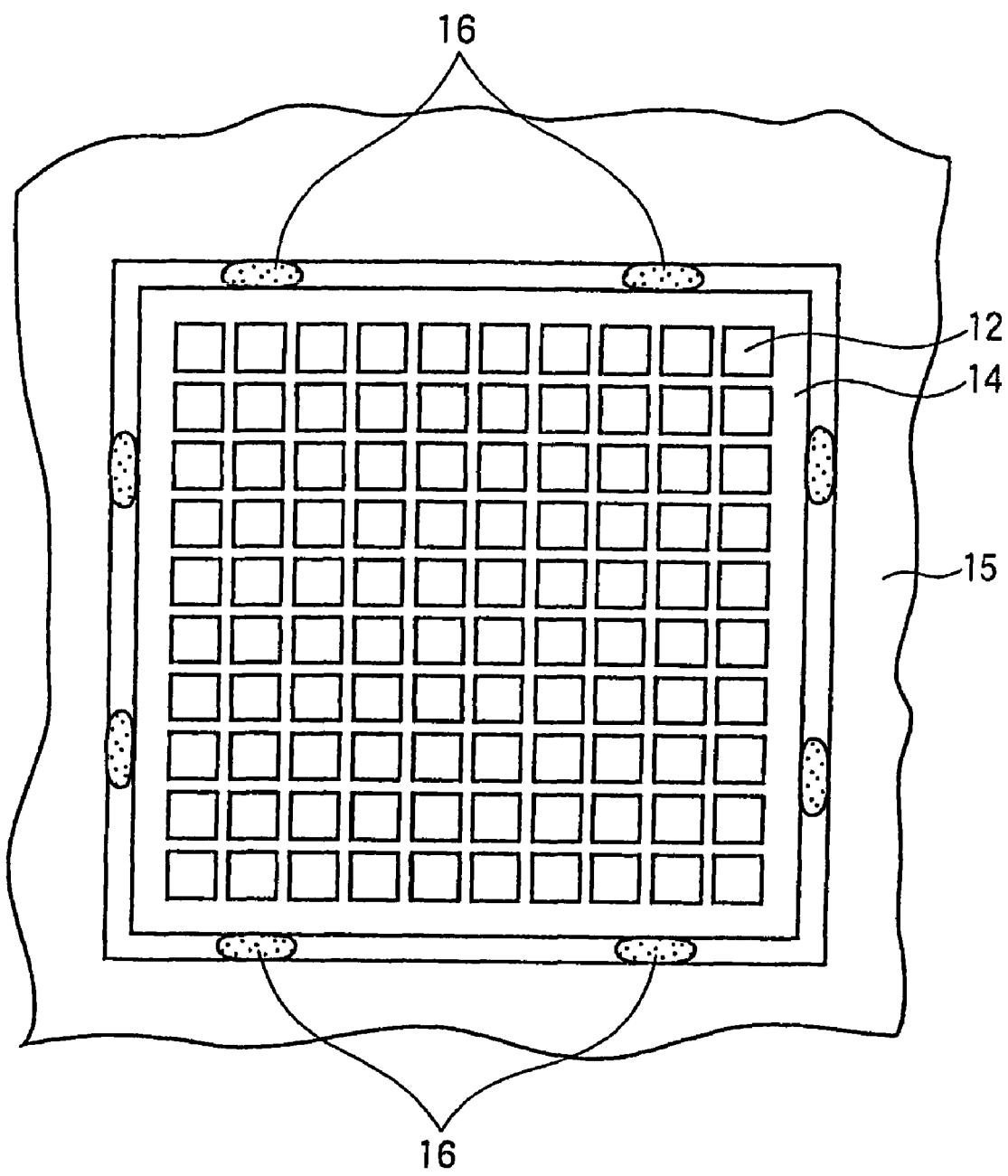
FIG. 4 is a view showing a state of the CP aperture mask according to the second embodiment of the present invention wherein a block and a stopper part are adhesively connected by adhesive members at a plurality of positions.

The mask part 11 is divided into four blocks 14 and exchangeable by every block 14. Each block 14 has one hundred cells 12 that are arranged in a square shape. A stopper part 15 that positions the blocks 14 is provided around the blocks 14. The stopper part 15 and the respective blocks 14 are adhesively connected by means of adhesive members 16, which include carbon. As shown in FIG. 3, the stopper part 15 is supported by beam parts 17 via connecting parts 19 consisting of $SiO_2$. Thus, the stopper part 15 and the beam parts 17 function as a supporting part for the blocks 14. Herein, the adhesive members 16 are provided at the whole circumferences of the respective blocks 14, as shown in FIG. 2. However, as shown in FIG. 4, the adhesive members 16 may be provided only at a plurality of positions around the respective blocks 14.

Each block 14 consists of a film 21 made of silicon. One hundred character patterns 22 are formed in the one hundred cells 12, respectively. The stopper part 15 and the beam parts 17 are also made of silicon.

The above mask part 11 may be formed from a silicon wafer by an etching process and a machining process, as explained after.

The shaping beam SB formed by the rectangular aperture of the shaping aperture mask is selectively irradiated to a predetermined cell 12 of the CP aperture mask 10, so that a beam pattern is generated based on a character pattern of the cell 12. The beam pattern is projected at a reduction onto the semiconductor wafer.

The number of cells provided in one CP aperture mask 10 is not limited to four hundred. In addition, as described after, the number of cells included in one block is not limited to one hundred.

Next, a manufacturing method of the CP aperture mask 10 is explained. FIGS. 5(a) to 5(f) are sectional views explaining a surface processing step in the manufacturing step of the CP aperture mask 10. FIGS. 6(a) to 6(e) are sectional views explaining a reverse-surface processing step in the manufacturing step of the CP aperture mask 10.

At first, with reference to FIGS. 5(a) to 5(f), the surface processing step is explained.

At first, an SOI wafer 31 is prepared. As shown in FIG. 5(a), the SOI wafer 31 has a $SiO_2$ film 32 in the vicinity of a surface thereof. A surface Si part 31a and a main Si part 31b are separated by the $SiO_2$ film 32. The total thickness of the SOI wafer 31 is about 725 μm, which is satisfactory. The thickness of the surface Si part 31a has to be a thickness capable of completely interrupt the electron beam, and may be 2 μm or thicker when an electron beam of about 5 eV is used. The thickness of the $SiO_2$ film 32 may be satisfactorily in the order of submicron, which is practically used at the present.

Then, as shown in FIG. 5(b), a TEOS film 33 is formed on an upper surface of the surface Si part 31a. A photoresist film 34 is formed on the TEOS film 33. Then, a predetermined pattern is formed in the photoresist film 34 by a photolithography process.

Then, as shown in FIG. 5(c), the photoresist film 34 is used as a mask, and the TEOS film 33 is treated by a dry etching process. Then, as shown in FIG. 5(d), the photoresist film 34 is removed by an ashing process.

Herein, as a patterning step, electron beam writing technique may be used as well. In the case, resist for electron beam is applied onto the TEOS film 33, and then a pattern is formed by electron beam writing. Then, the resist for electron beam is used as a mask, and the TEOS film 33 is treated by an etching process. Then, the resist for electron beam is removed by an oxygen plasma ashing process.

After that, as shown in FIG. 5(e), the TEOS film 33 is used as a mask while the surface Si part 31a is etched. Thus, a pattern 22 corresponding to FIG. 3 is formed. At that time, the $SiO_2$ film 32 functions as a stopper layer.

After the pattern is formed, as shown in FIG. 5(f), the TEOS film 33 is treated by an ashing process, and a pattern-protecting film 35 is formed.

Next, with reference to FIGS. 6(a) to 6(e), the reverse-surface processing step is explained.

Figure 6:
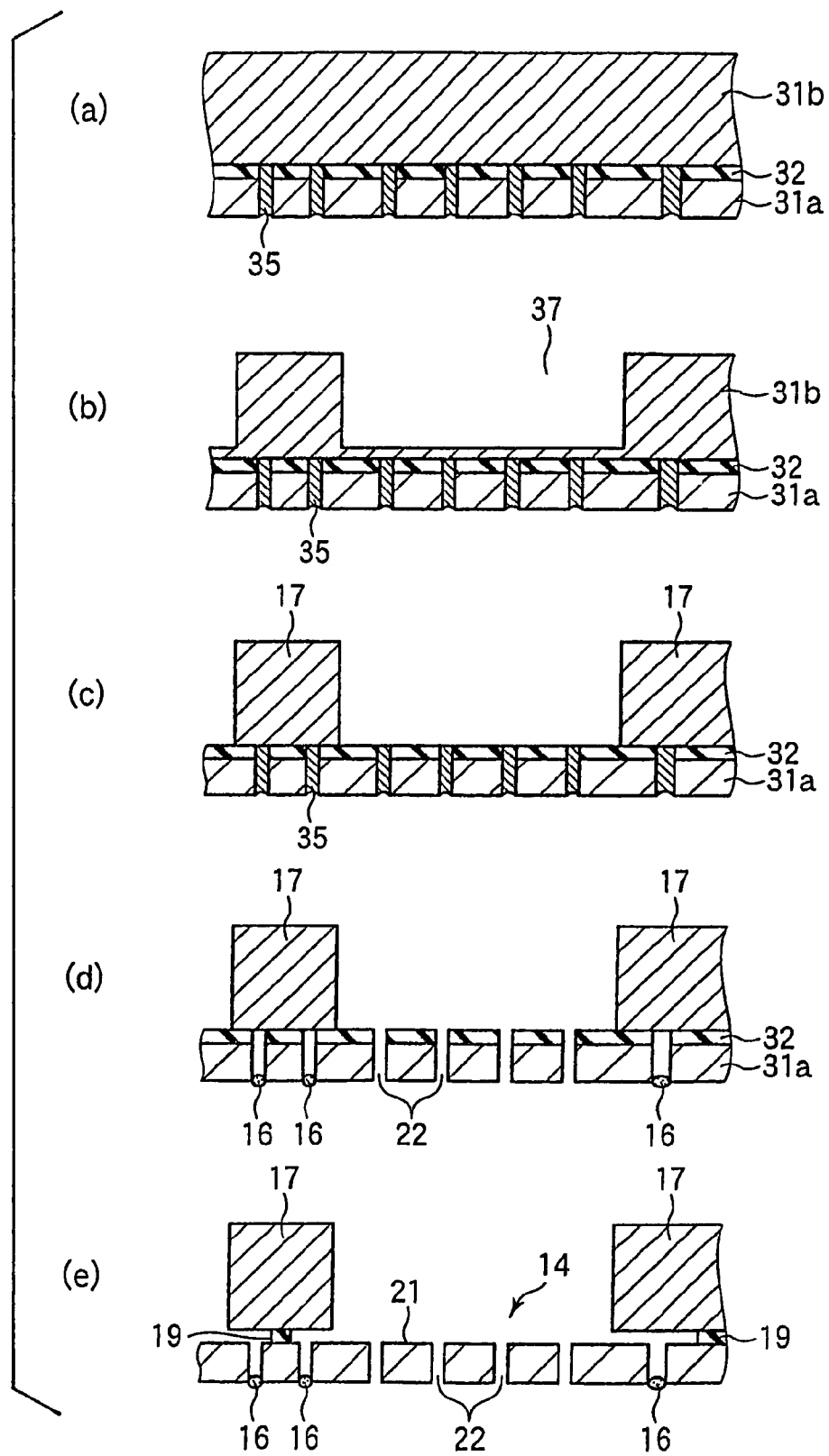
FIG. 6 is sectional views showing a reverse-surface processing step of the CP aperture mask according to the second embodiment of the present invention.

As shown in FIG. 6(a), the wafer that has been treated by the surface process step is arranged upside down. Then, as shown in FIG. 6(b), a deep hole 37 is formed at a portion of the main Si part 31b, at which a beam part is not to be formed, by a machining process such as a drilling process or a blasting process. It is preferable that the deep hole has a depth of 500 μm or more, more preferably 600 μm or more. Then, as shown in FIG. 6(c), the portion of the main Si part 31b, at which a beam part is not to be formed, is completely removed by a dry etching process. Thus, beam parts 17 are formed.

After that, as shown in FIG. 6(d), the pattern-protecting film 35 is removed, and connecting portions of the block 14, which are to be separated from the block 14, are fixed by adhesive members 16. After that, as shown in FIG. 6(e), the $SiO_2$ film 32 is removed by a wet etching process while the connecting portions 19 are left. Thus, the CP aperture mask 10 having the exchangeable blocks 14 is formed in a state shown in FIG. 3.

Thus, when a mask pattern is formed on a surface by a dry etching process and the reverse surface is processed by a machining process and a (dry or wet) etching process, the CP aperture mask can be manufactured rapidly.

Next, a pattern exchanging method of the CP aperture mask 10 is explained with reference to FIGS. 7(a) to 7(d).

In the present embodiment, the one hundred cells 12 having the respective different character patterns form the one exchangeable block 14. Thus, a specified pattern can be exchanged by exchanging the block 14.

At first, in the CP aperture mask 10 as shown in FIG. 3, as shown in FIG. 7(a), the adhesive members 16 of the block 14 to be exchanged are removed by an ashing process or the like. Thus, the block 14 is separated, and falls onto the beam parts 17.

Then, as shown in FIG. 7(b), the separated block 14 is removed. Then, as shown in FIG. 7(c), a new block 14' having a desired pattern is placed on the beam parts 17 while the new block 14' is positioned by the stopper part 15. In the case, the new block 14' may be prepared in advance in accordance with the same manufacturing method as the above method described for the embodiment.

After that, as shown in FIG. 7(d), the new block 14' placed on the beam parts 17 and the stopper part 15 are adhesively connected by means of adhesive members. In the case, an arrangement height of the new block 14' is lower than that of the original block 14 by a thickness of the connecting parts 19. However, since the thickness of the connecting parts 19 is usually in the order of submicron, the above difference of the arrangement height between the blocks has no effect on the exposure.

As described above, the adhesive members 16 connecting the block 14 having a pattern to be exchanged are removed by the ashing process, the block 14 is taken out, the new block 14' is placed at a position on the beam parts 17 substantially corresponding to the removed block 14 while the new block 14' is positioned by the stopper part 15, and then the new block 14' and the stopper part 15 are adhesively connected by means of the adhesive members 16, so that the block 14 is exchanged in a very practical method. That is, the pattern exchanging operation can be carried out easily.

Next, an example of dimensions of a block fixing part that makes it possible to exchange a block for exchanging a pattern in the above manner is explained.

In order to achieve the above exchanging operation of the block, the stopper part and a or more margin parts for being adhesively connected to the block have to be added, which are unnecessary for the conventional CP aperture mask. It is important to determine dimensions of the block fixing part in view of making the added parts as small as possible and taking into consideration errors in the block exchanging operation.

At first, a case wherein the block 14 and the stopper part 15 are adhesively connected at a plurality of positions is explained with reference to FIG. 8.

The thickness of a film (membrane) 21 that forms the block 14 is a thickness capable of interrupting the electron beam. When an electron beam of about 5 eV is used, a thickness of about 2 μm is enough. The thickness of the connecting parts 19 are satisfactorily in the order of submicron, and may be 0.2 μm taking into consideration the actual SOI wafers.

In addition, a:b=1:2 is satisfied taking into consideration a margin when a new block is maximally dislocated in a block exchanging operation, wherein a is a distance between the stopper part 15 and the block 14 and b is a width of an overlapped portion of the beam 17 and the block 14. In the surface processing step, when the surface Si part is treated by a dry etching process while the TEOS film 33 is used as a mask, an undercut phenomenon (wherein an etched portion rounds under the TEOS film) may be caused at a side wall of the surface Si part. An amount of the rounding portion (an undercut amount) is about 10% (5% on one side) of the thickness of the surface Si part. In the case, since the thickness of the film 21 (surface Si part) is 2 μm, the undercut amount is about 0.2 μm. If the undercut amount is 2 to 5% of the distance a, the distance a can absorb deviation of the undercut amount. Thus, when the undercut amount is 0.2 μm, a=4 to 10 μm may be obtained. Taking that into consideration, a=5 μm is set. At that time, b=10 μm.

In addition, when the block 14 and the stopper 15 are adhesively connected at a plurality of positions, as shown in FIG. 6(e), the $SiO_2$ film 32 is wet etched to form the connecting parts 19. At that time, the etchant rounds under the stopper part 15. Thus, a half (5 μm) of the $SiO_2$ film 32 at the b portion (10 μm) is etched by the rounding etchant. A width of the stopper part 15 is 50 μm when the width of the stopper part 15: a width of the remaining SiO₂ film 32 (a width of the connecting part 19)=5:4, to ensure strength of the stopper part 15.

Figure 9:
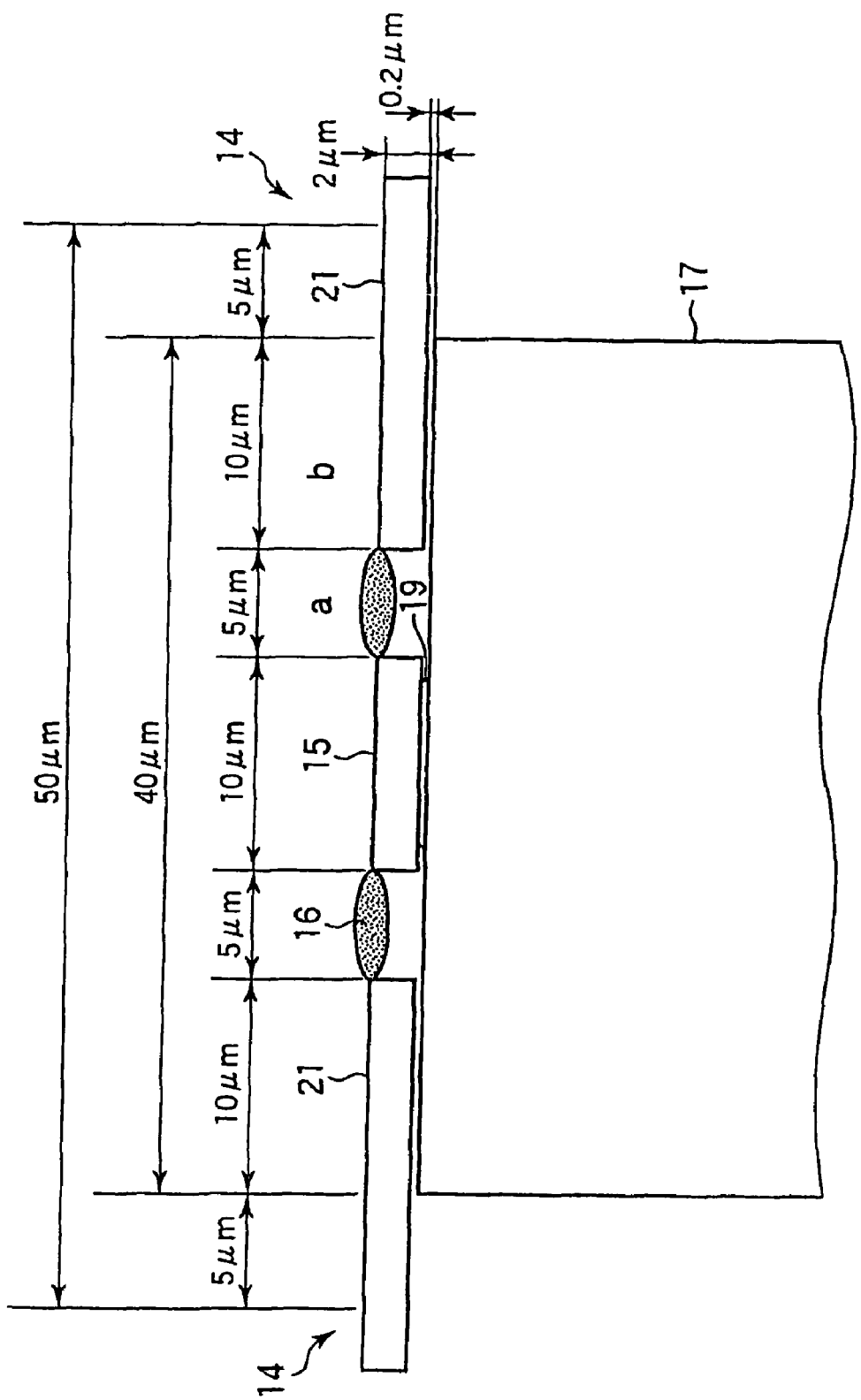
FIG. 9 is a sectional view showing another example of dimensions of a block fixing part that makes it possible to exchange a block in order to exchange a pattern.

Next, a case wherein the block 14 and the stopper part 15 are adhesively connected at the whole circumference is explained with reference to FIG. 9.

Figure 8:
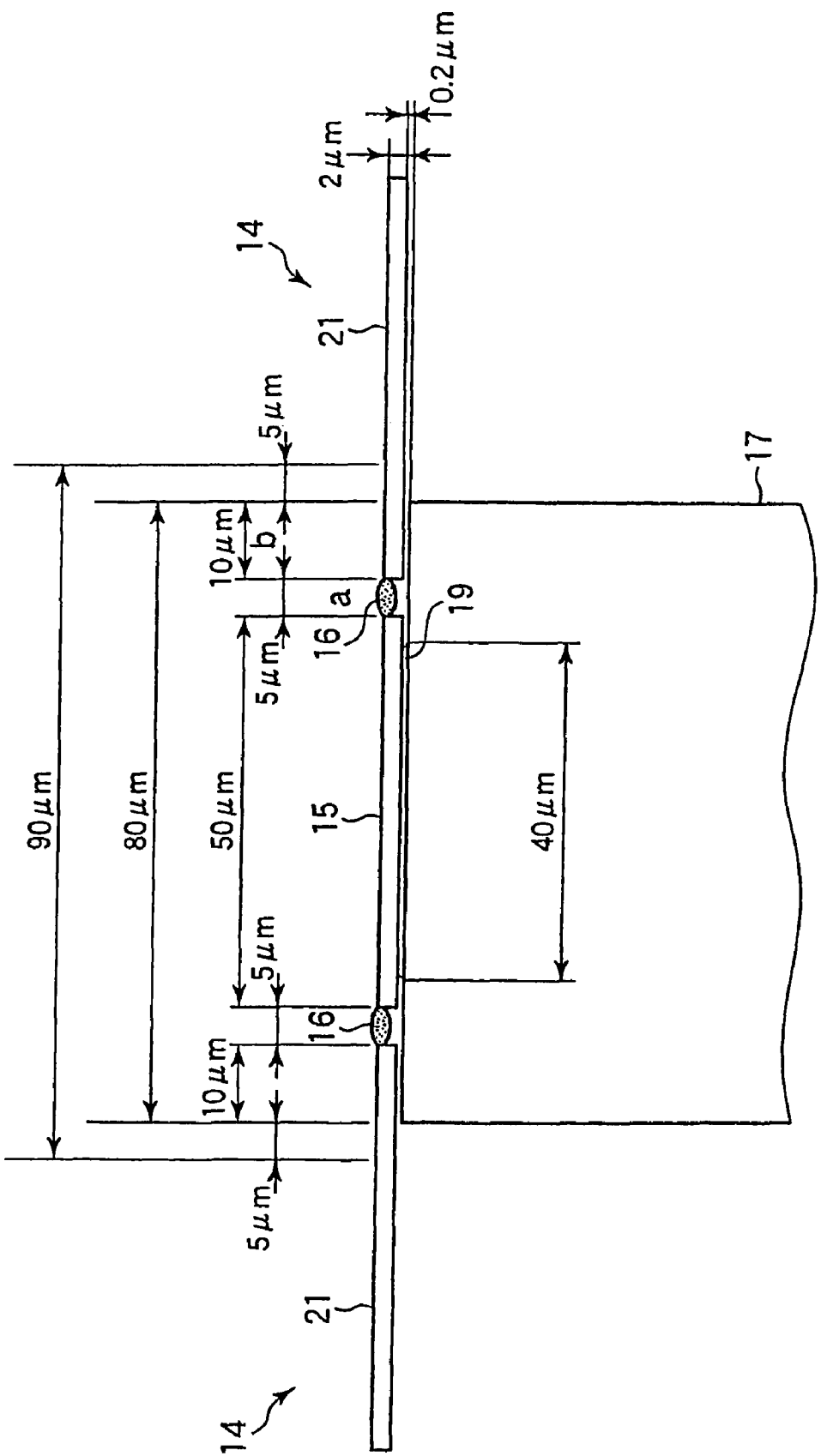
FIG. 8 is a sectional view showing an example of dimensions of a block fixing part that makes it possible to exchange a block in order to exchange a pattern.

In the case, the thickness of the membrane 21, the thickness of the connecting parts 19, the width of a, and the width of b are the same as those in FIG. 8. However, in the case, when the SiO₂ film 32 is wet etched to form the connecting parts 19, the etchant doesn't round under the stopper part 15. Thus, the width of the stopper 15 is different. That is, in the case, the width of the stopper 15 may be determined in such a manner that the undercut 0.2 μm of the membrane 21 corresponds to several % of the width of the stopper 15. If the undercut 0.2 μm of the membrane 21 corresponds to 2% of the width of the stopper 15, the width of the stopper 15 is 10 μm. When the etching rate of the wet etching process is about 0.1 μm/min, the width of the connecting part 19 can be controlled to be 8 μm or above. Thus, the strength of the stopper part can be maintained enough.

Next, an arrangement of the blocks 14 and dimensions thereof, in which the number of cells 12 formed in one block 14 is changed, is explained.

In the CP aperture mask, deflection of the electron beam has to be reduced as much as possible. For that purpose, it is preferable that the blocks 14 are arranged in such a manner that a circle (tangent circle) surrounding outermost blocks 14 in the mask portion 11 has a minimum diameter. Furthermore, it is preferable that the cells 12 are arranged in such a manner that the block 14 has a square shape, in view of facility in manufacturing a spare block and high density of arrangement of the cells 12 in the CP aperture mask.

Herein, taking into consideration the above point, a case is explained wherein four hundred square cells 12 are arranged in one CP aperture mask in such a manner that each block 14 has a square shape. In the following embodiments, the number of cells 12 arranged in each block 14 is 1, 4, 16, 25, 100 and 400. Each cell 12 has a square shape whose side is of 20 μm. The electron beam is □ 20 μm+α (square beam having a side of 20 μm+α), and hence a gap between adjacent cells in a block 14 is 5 μm.

Figure 10:
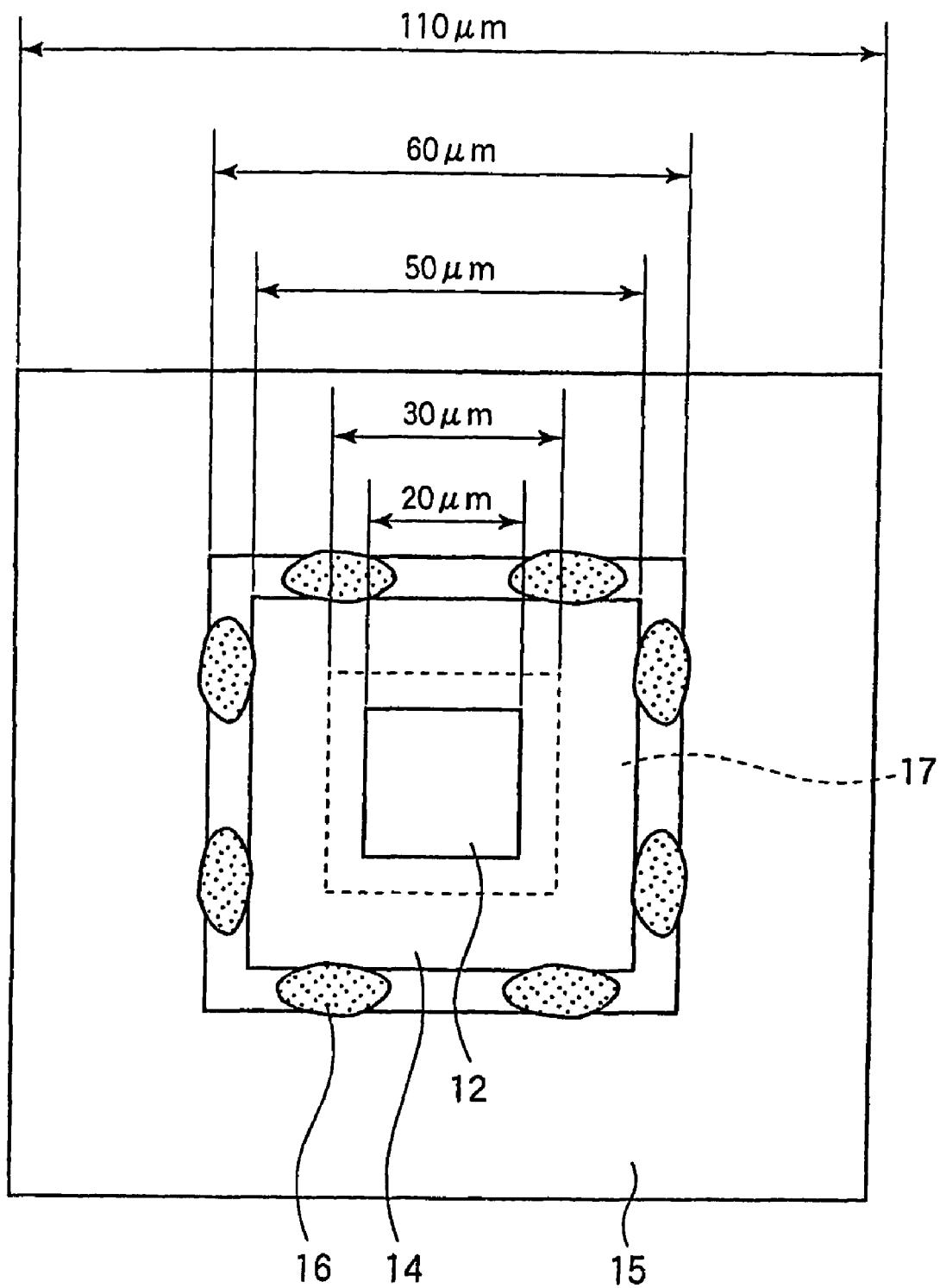
FIG. 10 is a plan view showing an example of dimensions of a block and a block fixing part wherein one cell is mounted on the block.
Figure 11:
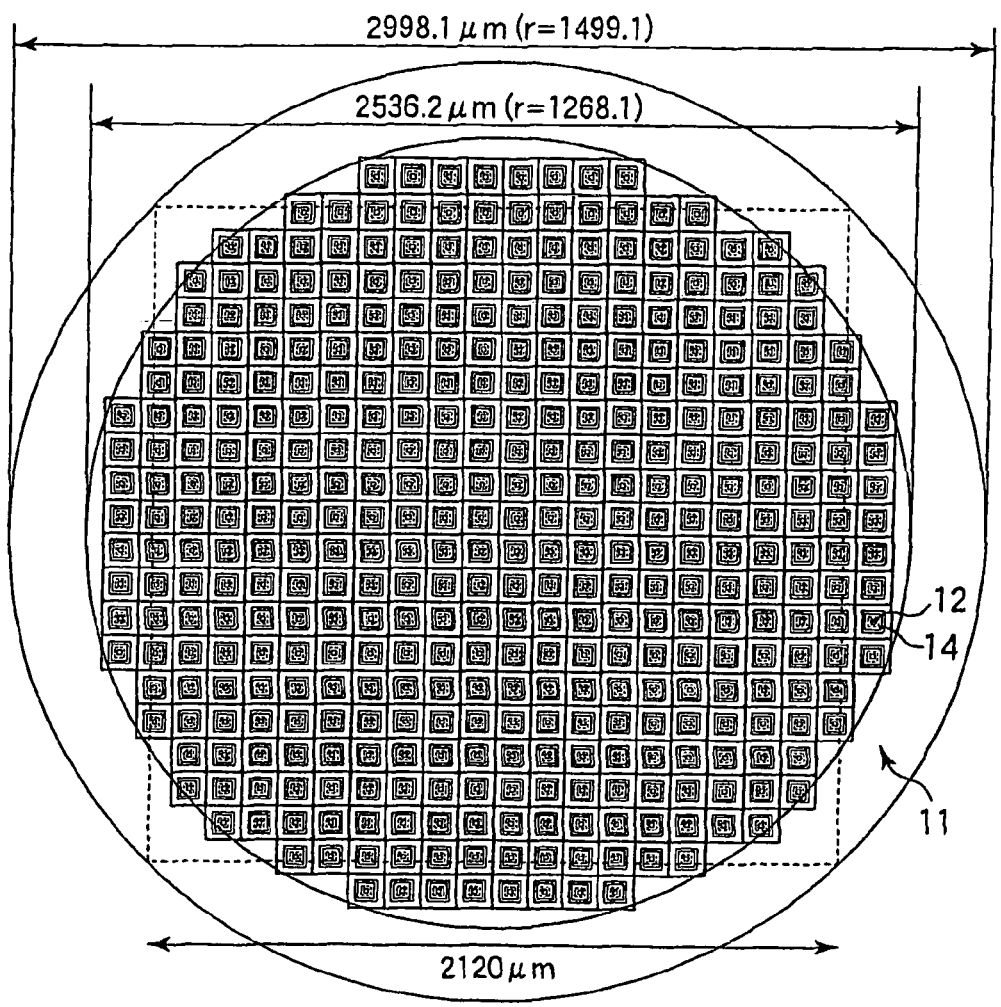
FIG. 11 is a plan view showing an arrangement of blocks wherein one cell is mounted on each block and wherein a circle surrounding the blocks and the block fixing parts has a minimum diameter.

At first, regarding a case wherein one block 14 includes one cell 12, an example of dimensions of a block 14 and a block fixing part (a side wall surface of the stopper part 15) is shown in FIG. 10. Herein, the adhesive members 16 are provided at a plurality of positions around the block 14. As shown in FIG. 10, in the case, the block 14 and the stopper part 15 form a square having a side of 110 μm. If they are arranged in a square shape, since the number of cells 12 is 400, all the blocks 14 and the block fixing parts form a square having a side of 2120 μm. At that time, the diameter of a circle surrounding all the blocks 14 and the block fixing parts is 2998.1 μm. If the squares, each of which consists of the block 14 and the stopper part 15, are arranged in a polygon-like shape as shown in FIG. 11, the diameter of a tangent circle surrounding all the blocks 14 and the block fixing parts is 2536.2 μm. That is, in the case, if they are arranged in a polygon-like shape, the diameter of a tangent circle surrounding all the blocks 14 and the block fixing parts in the mask portion 11 is minimal.

Figure 13:
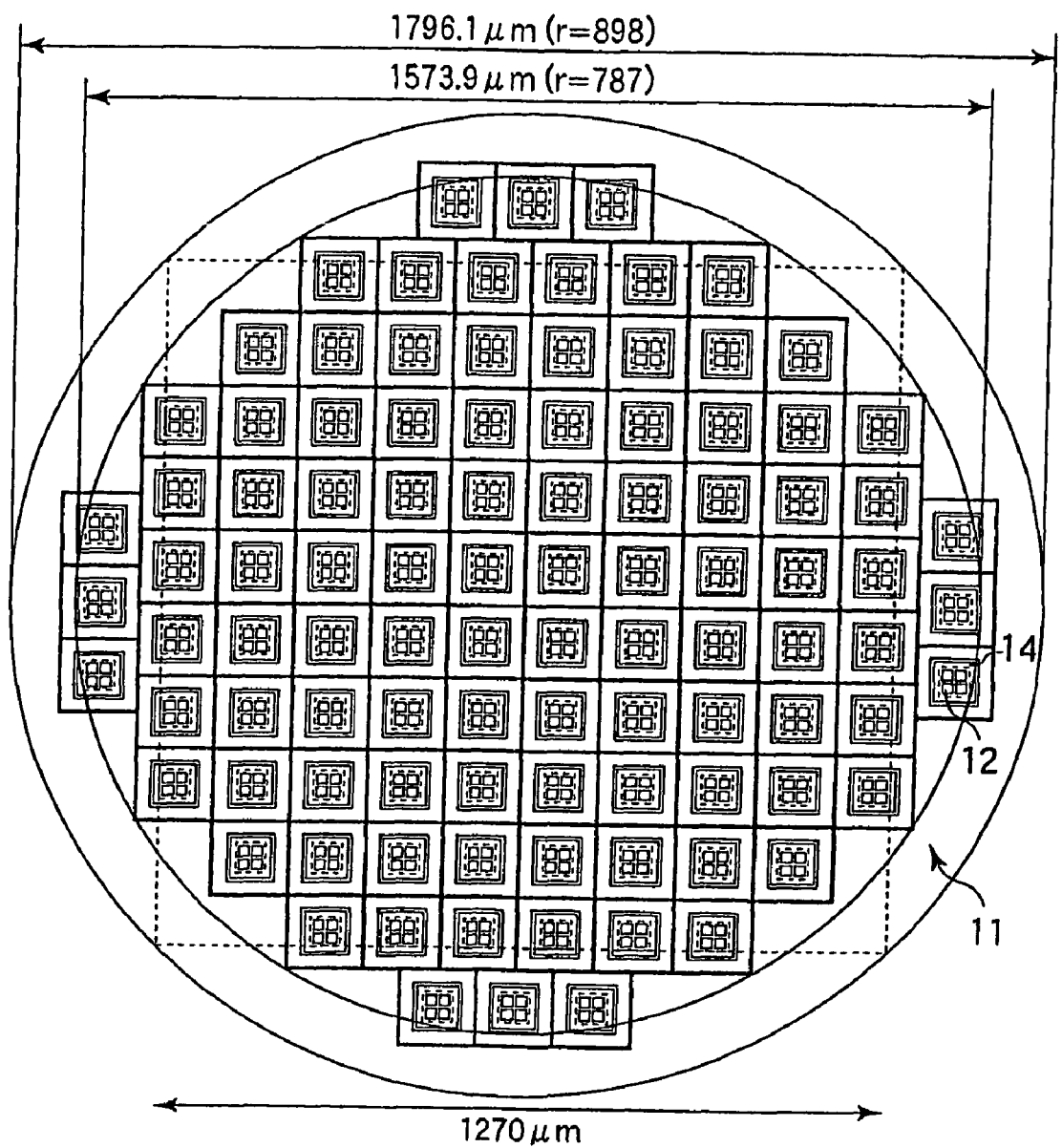
FIG. 13 is a plan view showing an arrangement of blocks wherein four cells are mounted on each block and wherein a circle surrounding the blocks and the block fixing parts has a minimum diameter.

Next, regarding a case wherein one block 14 includes four cells 12, an example of dimensions of a block 14 and a block fixing part is shown in FIG. 12. Herein as well, the adhesive members 16 are provided at a plurality of positions around the block 14. As shown in FIG. 12, in the case, the block 14 and the stopper part 15 form a square having a side of 135 μm. If they are arranged in a square shape, since the number of cells 12 is 400, all the blocks 14 and the block fixing parts form a square having a side of 1270 μm. At that time, the diameter of a circle surrounding all the blocks 14 and the block fixing parts is 1796.1 μm. If the squares, each of which consists of the block 14 and the stopper part 15, are arranged in a polygon-like shape as shown in FIG. 13, the diameter of a tangent circle surrounding all the blocks 14 and the block fixing parts is 1573.9 μm. That is, in the case too, if they are arranged in a polygon-like shape, the diameter of a tangent circle surrounding all the blocks 14 and the block fixing parts in the mask portion 11 is minimal. In FIG. 12, the adhesive members are omitted.

Next, regarding a case wherein one block 14 includes sixteen cells 12, an example of dimensions of a block 14 and a block fixing part is shown in FIG. 14. Herein as well, the adhesive members 16 are provided at a plurality of positions around the block 14. As shown in FIG. 14, in the case, the block 14 and the stopper part 15 form a square having a side of 185 μm. If they are arranged in a square shape, since the number of cells 12 is 400, all the blocks 14 and the block fixing parts form a square having a side of 845 μm. At that time, the diameter of a circle surrounding all the blocks 14 and the block fixing parts is 1195 μm. If the squares, each of which consists of the block 14 and the stopper part 15, are arranged in a polygon-like shape as shown by a dotted line in FIG. 15, the diameter of a tangent circle surrounding all the blocks 14 and the block fixing parts is 1219.5 μm. That is, in the case, if they are arranged in a square shape, the diameter of a tangent circle surrounding all the blocks 14 and the block fixing parts in the mask portion 11 is minimal. In FIG. 14, the adhesive members are omitted.

Figure 16:
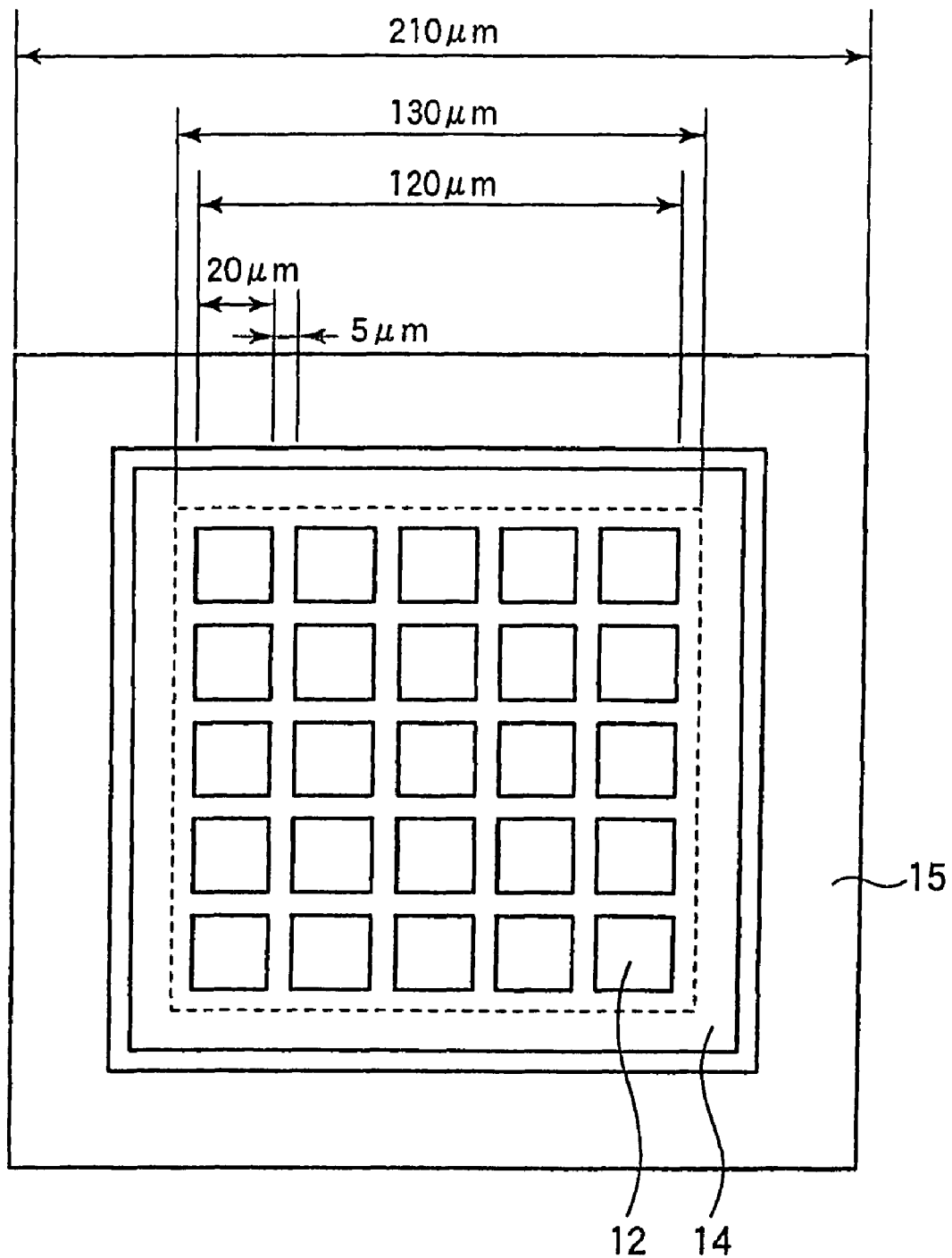
FIG. 16 is a plan view showing an example of dimensions of a block and a block fixing part wherein twenty-five cells are mounted on the block.

Next, regarding a case wherein one block 14 includes twenty-five cells 12, an example of dimensions of a block 14 and a block fixing part is shown in FIG. 16. Herein as well, the adhesive members 16 are provided at a plurality of positions around the block 14. As shown in FIG. 16, in the case, the block 14 and the stopper part 15 form a square having a side of 210 μm. If they are arranged in a square shape, since the number of cells 12 is 400, all the blocks 14 and the block fixing parts form a square having a side of 760 μm. At that time, the diameter of a circle surrounding all the blocks 14 and the block fixing parts is 1074.8 μm. If the squares, each of which consists of the block 14 and the stopper part 15, are arranged in a polygon-like shape as shown by a dotted line in FIG. 17, the diameter of a tangent circle surrounding all the blocks 14 and the block fixing parts is 1187.1 μm. That is, in the case too, if they are arranged in a square shape, the diameter of a tangent circle surrounding all the blocks 14 and the block fixing parts in the mask portion 11 is minimal. In FIG. 16, the adhesive members are omitted.

Figure 18:
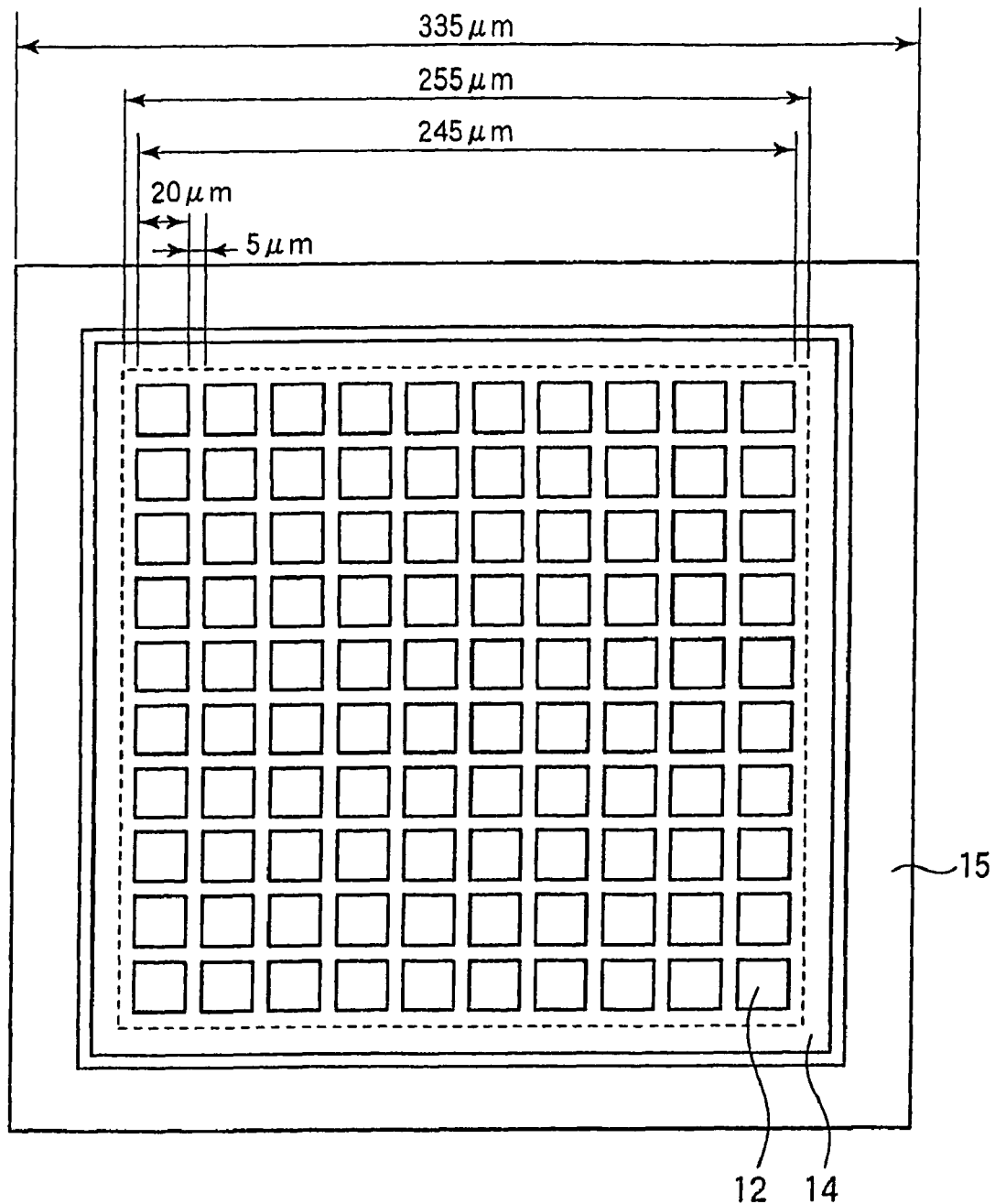
FIG. 18 is a plan view showing an example of dimensions of a block and a block fixing part wherein one hundred cells are mounted on the block.
Figure 19:
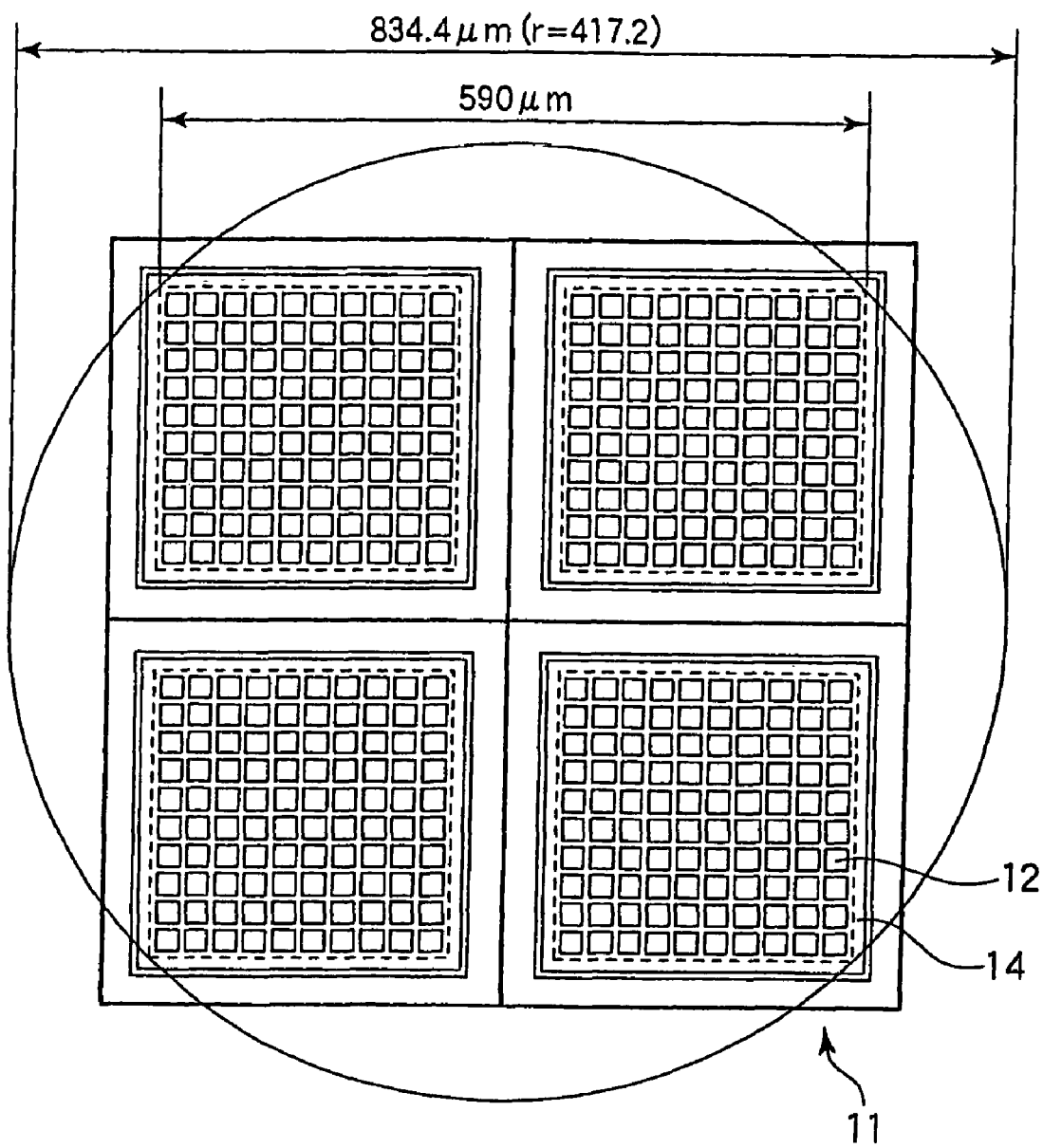
FIG. 19 is a plan view showing an arrangement of blocks wherein one hundred cells are mounted on each block and wherein a circle surrounding the blocks and the block fixing parts has a minimum diameter.

Next, regarding a case wherein one block 14 includes one hundred cells 12, an example of dimensions of a block 14 and a block fixing part is shown in FIG. 18. Herein as well, the adhesive members 16 are provided at a plurality of positions around the block 14. As shown in FIG. 18, in the case, the block 14 and the stopper part 15 form a square having a side of 335 μm. If they are arranged in a square shape, since the number of cells 12 is 400 and the number of blocks 14 is four, all the blocks 14 and the block fixing parts form a square having a side of 590 μm. At that time, the diameter of a circle surrounding all the blocks 14 and the block fixing parts is 834.4 μm. In the case, it is clear that when they are arranged in a square shape as described above, the diameter of a tangent circle surrounding all the blocks 14 and the block fixing parts in the mask portion 11 is minimal. In FIG. 18, the adhesive members are omitted.

Figure 20:
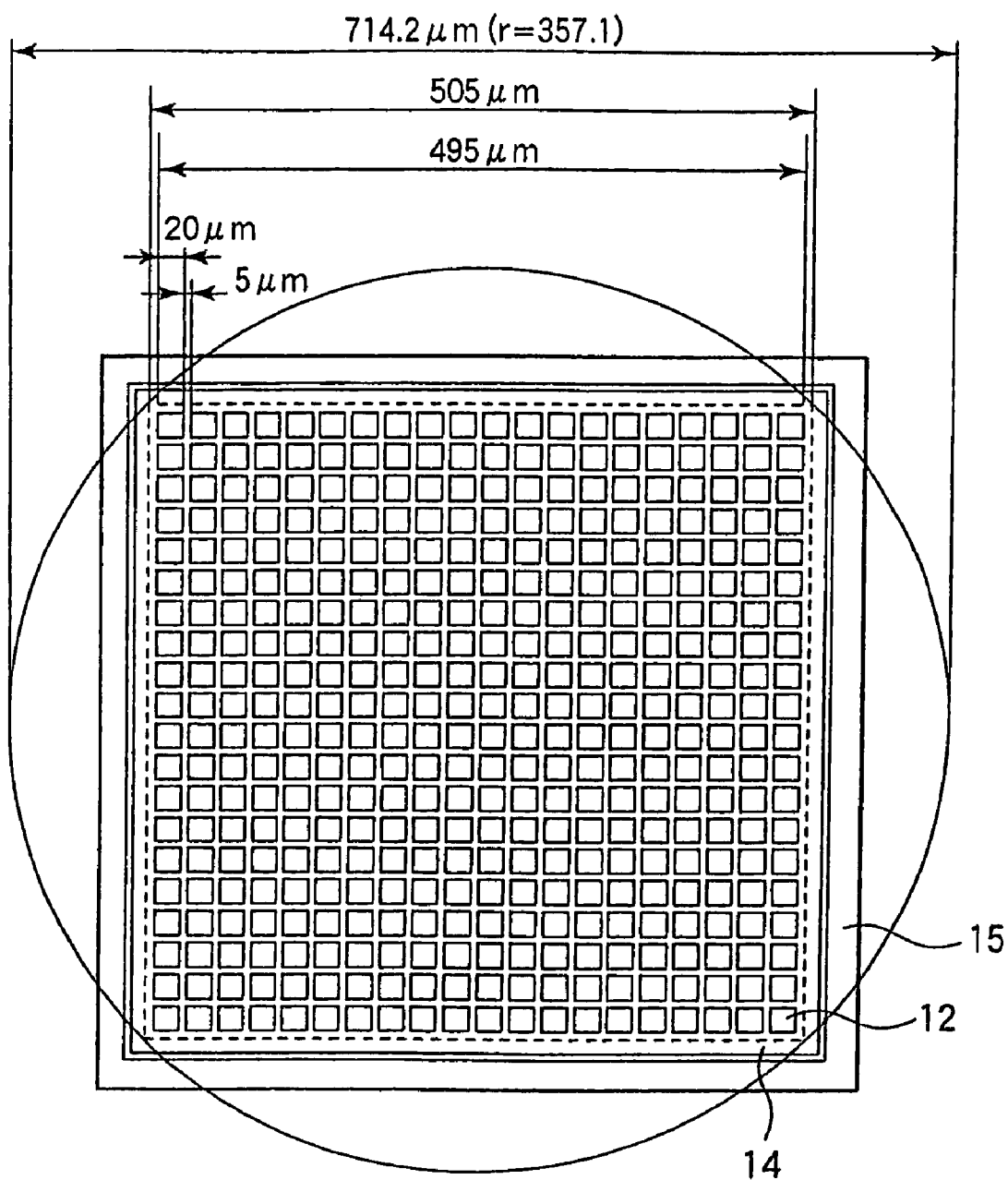
FIG. 20 is a plan view showing an example of dimensions of a block and a block fixing part wherein four hundred cells are mounted on the block.

Next, regarding a case wherein one block 14 includes four hundred cells 12, an example of dimensions of a block 14 and a block fixing part is shown in FIG. 20. Herein as well, the adhesive members 16 are provided at a plurality of positions around the block 14. As shown in FIG. 20, in the case, the block 14 and the stopper part 15 form a square having a side of 505 µm. At that time, the diameter of a circle surrounding all the blocks 14 and the block fixing parts is 714.2 µm. In FIG. 20, the adhesive members are omitted.

The above results are shown together in the following Table 1.

TABLE 1

|  | SIDE OF SQUARE ARRANGEMENT(µm) | TANGENT CIRCLE DIAMETER OF SQUARE ARRANGEMENT(µm) | TANGENT CIRCLE DIAMETER OF POLYGON-LIKE ARRANGEMENT(µm) | MINIMAL TANGENT CIRCLE DIAMETER(µm) |
|---|---|---|---|---|
| 1CELL/BLOCK | 2120 | 2998 | 2536 | 2536 |
| 4CELL/BLOCK | 1270 | 1796 | 1574 | 1574 |
| 16CELL/BLOCK | 845 | 1195 | 1220 | 1195 |
| 25CELL/BLOCK | 760 | 1075 | 1187 | 1075 |
| 100CELL/BLOCK | 590 | 834 | — | 834 |
| 400CELL/BLOCK | 505 | 714 | — | 714 |

As shown in Table 1, as the number of cells included in one block is increased, the diameter of a minimal tangent circle is decreased, that is, a deflection difference of the electron beam is decreased. In addition, handling characteristics are also improved. In view of those points, 25, 100 or 400 cells/block are preferable. Taking into consideration practical handling characteristics, 100 or 400 cells/block are preferable. However, as the number of cells included in one block is increased, the number of cells exchanged at one time is also increased. That is, more cells unnecessary to be exchanged may be exchanged. Then, the merits of exchange by each block may be reduced. In view of that point, 400 cells/block is inferior in the merits of exchange by each block. Thus, taking into consideration all the above aspects, 100 cells/block is most preferable.

In the above examples, the block 14 is formed by arranging the square cells 12 in a square shape. However, rectangular cells other than square cells may be arranged in a substantially square shape. In addition, the shape of each cell is not limited to the rectangular shape, but may be any shape. It is unnecessary that the number of cells in each block is common. In addition, the cell arrangement in one block is not limited to in the square shape. For example, the same number of cells 12 is respectively arranged in a vertical direction and in a horizontal direction, in one block 14, in the above embodiments. However, the number of cells 12 may be different between in a vertical direction and in a horizontal direction.

In addition, if the mask portion 11 is circle, a distance from the center thereof to an outer circumference thereof is always constant. Thus, the deflection distance of the electron beam is thought to become the least. Thus, as shown in FIG. 21, it may be thought that the mask portion 11 is formed in a substantially circle shape, a circle block 14a is arranged at a center of the mask portion 11 and nine sectoral blocks 14b are arranged around the circle block 14a.

The present invention is not limited to the above embodiments, but may be variously modified. For example, in the above embodiments, the mask portion is made from a SOI wafer. However, this invention is not limited thereto. In addition, in the above embodiments, the stopper part and the block are adhesively connected by the adhesive members including carbon, and the adhesive members are removed by an ashing process at an exchanging step. However, other adhesive members that can be removed by another method, for example by means of a medicament, may be also used.

The invention claimed is:

1. A pattern exchanging method of a transfer mask for exposure, the transfer mask for exposure including a mask portion having a plurality of cells, each cell having an opening with a predetermined pattern, wherein the mask portion has one or more blocks, each of which contains one or more cells, the mask portion has one or more supporting parts that supports the one or more blocks, the mask portion has one or more adhesive members that adhesively connects the one or more blocks and the one or more supporting parts and are capable of being removed at any time, each of the supporting parts includes a stopper part adhesively connected to the corresponding block via the adhesive member, and a beam part that supports the stopper part and that protrudes under the corresponding block, and the blocks are arranged in such a manner that a circle surrounding all the blocks has a minimum diameter, wherein each block, stopper part and beam part is made of silicon with an SiO$_2$ film formed between them, the transfer mask for exposure being made by:

a first step of forming the plurality of cells and the stopper parts on a surface of the mask portion by a dry etching process;

after the first step, a second step of forming the beam parts on a reverse-surface of the mask portion by both a machining process and an etching process;

after the second step, a third step of connecting the blocks and the stopper parts by providing the adhesive members therebetween; and after the third step, a fourth step of removing the SiO$_2$ film to make the blocks exchangeable, the pattern exchanging method comprising:

a step of removing the adhesive member from between the block having a pattern to be exchanged and its corresponding stopper part, in order to remove the block, a step of placing a new block on the beam part of the supporting part corresponding to the removed block, and a step of connecting the stopper part of the supporting part corresponding to the removed block and the new block by providing the adhesive member therebetween.

2. A transfer mask for exposure according to claim 1, wherein the plurality of cells can be exchanged by every block.

3. A transfer mask for exposure according to claim 1, wherein
each of the blocks contains a plurality of rectangular cells that are arranged in a square shape.

4. A transfer mask for exposure according to claim 1, wherein
each of the supporting parts is arranged to surround the corresponding block, and
one or more adhesive members are arranged at the whole circumference of the block or at a plurality of positions around the block.

5. A transfer mask for exposure according to claim 1, wherein
the blocks and the supporting parts mainly consist of silicon, and
the adhesive members consist of a material including carbon.

6. A manufacturing method of a transfer mask for exposure,
the transfer mask for exposure including a mask portion having a plurality of cells, each cell having an opening with a predetermined pattern,
wherein
the mask portion has one or more blocks, each of which contains one or more cells,
the mask portion has one or more supporting parts that supports the one or more blocks,
the mask portion has one or more adhesive members that adhesively connects the one or more blocks and the one or more supporting parts and are capable of being removed at any time,
each of the supporting parts includes a stopper part adhesively connected to the corresponding block via the adhesive member, and a beam part that supports the stopper part and that protrudes under the corresponding block,
wherein each block, stopper part and beam part is made of silicon with an $SiO_2$ film formed between them,
the method comprising:
a first step of forming the plurality of cells and the stopper parts on a surface of the mask portion by a dry etching process,
a second step of forming the beam parts on a reverse-surface of the mask portion by both a machining process and an etching process, after the first step,
a third step of connecting the blocks and the stopper parts by providing the adhesive members therebetween, after the second step; and
after the third step, a fourth step of removing the $SiO_2$ film to make the blocks exchangeable.

7. A transfer mask for exposure according to claim 6, wherein
the plurality of cells can be exchanged by every block.

8. A transfer mask for exposure according to claim 6, wherein
each of the blocks contains a plurality of rectangular cells that are arranged in a square shape.

9. A transfer mask for exposure according to claim 6, wherein
each of the supporting parts is arranged to surround the corresponding block, and
one or more adhesive members are arranged at the whole circumference of the block or at a plurality of positions around the block.

10. A transfer mask for exposure according to claim 6, wherein
the blocks and the supporting parts mainly consist of silicon, and
the adhesive members consist of a material including carbon.

* * * * *